United States Patent
Cai et al.

(10) Patent No.: US 10,143,110 B2
(45) Date of Patent: Nov. 27, 2018

(54) MIDDLE FRAME MEMBER AND METHOD FOR MANUFACTURING MIDDLE FRAME MEMBER

(71) Applicant: HUAWEI TECHNOLOGIES CO., LTD., Shenzhen, Guangdong (CN)

(72) Inventors: Ming Cai, Shenzhen (CN); Banghong Hu, Shenzhen (CN); Longyu Li, Shenzhen (CN)

(73) Assignee: HUAWEI TECHNOLOGIES CO., LTD., Shenzhen, Guangdong (CN)

(\*) Notice: Subject to any disclaimer, the term of this patent is extended or adjusted under 35 U.S.C. 154(b) by 0 days.

(21) Appl. No.: 15/971,914

(22) Filed: May 4, 2018

(65) Prior Publication Data
US 2018/0255664 A1    Sep. 6, 2018

Related U.S. Application Data

(63) Continuation of application No. PCT/CN2016/082729, filed on May 20, 2016.

(30) Foreign Application Priority Data

Nov. 16, 2015  (CN) .......................... 2015 1 0782892

(51) Int. Cl.
*H05K 7/20* (2006.01)
*H04M 1/02* (2006.01)
(Continued)

(52) U.S. Cl.
CPC ........ *H05K 7/20509* (2013.01); *H04M 1/026* (2013.01); *H05K 7/20* (2013.01);
(Continued)

(58) Field of Classification Search
CPC combination set(s) only.
See application file for complete search history.

(56) References Cited

U.S. PATENT DOCUMENTS

| 8,278,880 B2 | 10/2012 | Nakajima et al. |
| 8,988,886 B1 * | 3/2015 | Arao ..................... G06F 1/1656 361/679.01 |

(Continued)

FOREIGN PATENT DOCUMENTS

| CN | 2460829 Y | 11/2001 |
| CN | 2865031 Y | 1/2007 |

(Continued)

*Primary Examiner* — Cindy Trandai
(74) *Attorney, Agent, or Firm* — Womble Bond Dickinson (US) LLP

(57) ABSTRACT

Embodiments of the present disclosure provide a middle frame member including: a middle frame substrate body; a first metal layer, attached to a first area of the middle frame substrate body, where a coefficient of heat conductivity of the first metal layer is greater than a coefficient of heat conductivity of the middle frame substrate body, the first area includes all or a part of an outer surface of the middle frame substrate body, and the first metal layer is used to conduct, to the entire first metal and the middle frame substrate body, heat generated by at least one of the components that is in contact with or adjacent to the first metal layer; and a passivated insulation layer, attached to a surface of the first metal layer.

16 Claims, 13 Drawing Sheets

(51) Int. Cl.
*G06F 1/16* (2006.01)
*G06F 1/20* (2006.01)

(52) U.S. Cl.
CPC ....... H05K 7/20445 (2013.01); *G06F 1/1656* (2013.01); *G06F 1/203* (2013.01)

(56) References Cited

U.S. PATENT DOCUMENTS

| | | | |
|---|---|---|---|
| 2009/0010818 A1* | 1/2009 | Song .................... | H05H 1/2406 422/186.05 |
| 2010/0118378 A1* | 5/2010 | Robertsson ............. | G07D 7/00 359/267 |
| 2011/0038123 A1 | 2/2011 | Janik et al. | |
| 2012/0034884 A1* | 2/2012 | Sekine .................. | H01Q 1/002 455/90.3 |
| 2012/0147716 A1* | 6/2012 | Hara ...................... | G11B 5/314 369/13.33 |
| 2012/0281364 A1 | 11/2012 | Gunderson | |
| 2013/0106527 A1* | 5/2013 | Gupta ..................... | H01G 5/16 333/33 |
| 2013/0182412 A1* | 7/2013 | Choi .................... | G02B 6/0085 362/97.1 |
| 2013/0250504 A1* | 9/2013 | Choi ....................... | G06F 1/203 361/679.26 |
| 2014/0017512 A1 | 1/2014 | Iimori et al. | |
| 2014/0313426 A1* | 10/2014 | Sato ........................ | H04N 5/64 348/836 |
| 2016/0182112 A1* | 6/2016 | Kim ....................... | H01Q 1/243 455/572 |
| 2016/0315651 A1* | 10/2016 | Hong .................. | H04B 1/3888 |
| 2018/0115069 A1* | 4/2018 | Mai ......................... | H01Q 5/30 |

FOREIGN PATENT DOCUMENTS

| | | |
|---|---|---|
| CN | 101156791 A | 4/2008 |
| CN | 103140064 A | 6/2013 |
| CN | 203206330 U | 9/2013 |
| CN | 103457021 A | 12/2013 |
| CN | 103540979 A | 1/2014 |
| CN | 103700965 A | 4/2014 |
| CN | 103841784 A | 6/2014 |
| CN | 203942555 U | 11/2014 |
| CN | 105141725 A | 12/2015 |
| EP | 2085858 A1 | 8/2009 |

* cited by examiner

100

Electroplate a first metal layer in a first area of a middle frame substrate body, where a coefficient of heat conductivity of the first metal layer is greater than a coefficient of heat conductivity of the middle frame substrate body, the first area includes all or a part of an outer surface of the middle frame substrate body, and the first metal layer is used to conduct, to the middle frame substrate body, heat generated by at least one of components that is in contact with or adjacent to the first metal layer ~ 110

Perform passivation processing on the first metal layer, so that a passivated insulation layer used for resisting corrosion is formed on a surface of the first metal layer ~ 120

Start

Electroplate a second metal layer in a second area of a middle frame substrate body, where the second area is used to connect to a metal antenna spring plate in an electronic product, and a material of the second metal is the same as that of the metal antenna spring plate or an electrode potential difference between the second metal and the metal antenna spring plate is less than a preset threshold ~ 210

FIG. 2

MIDDLE FRAME MEMBER AND METHOD FOR MANUFACTURING MIDDLE FRAME MEMBER

CROSS-REFERENCE TO RELATED APPLICATIONS

This application is a continuation of International Application No. PCT/CN2016/082729, filed on May 20, 2016, which claims priority to Chinese Patent Application No. 201510782892.X, filed on Nov. 16, 2015. The disclosures of the aforementioned applications are hereby incorporated by reference in their entireties.

TECHNICAL FIELD

The present disclosure relates to the communications field, and in particular, to a middle frame member and a method for manufacturing a middle frame member.

BACKGROUND

With development of electronic products, the electronic products have an increasingly high requirement for heat dissipation. A material of a middle frame member in an existing electronic product gradually cannot meet a current heat dissipation requirement. For example, a middle frame material of a current mobile phone gradually cannot meet a current heat dissipation requirement, and particularly, a mobile phone chip area with relatively high power consumption emits a relatively large amount of heat. Consequently, temperature of some positions of a middle frame member is excessively high. A frequently-used material of an existing mobile phone middle frame is die casting magnesium alloy, stainless steel, die casting aluminum alloy, or die casting zinc alloy. A coefficient of heat conductivity of the material is between 10 to 160 W/m·k, and the material cannot conduct heat rapidly. Consequently, heat of some high-temperature areas of the middle frame member cannot be conducted to a low-temperature area in time, temperature of the high-temperature positions cannot be effectively reduced, and an application requirement for heat dissipation of a current mobile phone cannot be met.

Therefore, how to improve heat dissipation performance of a middle frame member of an electronic product becomes an urgent problem to be resolved.

SUMMARY

Embodiments of the present disclosure provide a middle frame member and a method for manufacturing a middle frame member. According to the method, heat dissipation performance of a middle frame member of an electronic product can be improved.

According to a first aspect, a method for manufacturing a middle frame member is provided, where the middle frame member is a support part inside an electronic product for supporting components in the electronic product, the middle frame member includes a middle frame substrate body and at least one metal-electroplated layer on a surface of the middle frame substrate body, and the method includes:

electroplating a first metal layer in a first area of the middle frame substrate body, where a coefficient of heat conductivity of the first metal is greater than a coefficient of heat conductivity of the middle frame substrate body, the first area includes all or a part of an outer surface of the middle frame substrate body, and the first metal layer is used to conduct, to the middle frame substrate body, heat generated by at least one of the components that is in contact with or adjacent to the first metal layer; and performing passivation processing on the first metal layer, so that a passivated insulation layer used for resisting corrosion is formed on a surface of the first metal layer.

Therefore, in this embodiment of the present disclosure, first metal with a high coefficient of heat conductivity is electroplated in a first area of a middle frame substrate body, and a heat-conducting capability of the middle frame member is improved by using the first metal layer, so that heat of some components that emit a large amount of heat can be effectively conducted to the middle frame substrate body in time, and excessively high partial temperature is avoided. In addition, the middle frame substrate body can conduct, as soon as possible, the heat generated by the components in an electronic device, so that heat dissipation performance of the middle frame member is improved.

It should be understood that the first area in this example of the present disclosure may be all or a part of the outer surface of the middle frame substrate body. For example, when the first area is all the middle frame substrate body, etching is subsequently performed on a grounded conductive area and an area that is in contact with a metal spring plate, to expose the substrate body or first metal for subsequent processing. The first area may not include the grounded conductive area and the area that is in contact with the metal spring plate, and the first metal layer is electroplated in another area, to improve a heat-conducting property of the middle frame member. Alternatively, the first area may include only an area corresponding to a part that emits a relatively large amount of heat in the electronic product. For example, the first area may include only an area that emits a relatively large amount of heat, such as a camera area or a CPU area. The first metal layer is electroplated in this area, to improve a heat-conducting property of the middle frame member. Alternatively, the first area may include only a second area and/or a third area mentioned below, that is, the first metal layer may be electroplated before a second metal layer and a third metal layer are electroplated in the second area and the third area. This embodiment of the present disclosure is not limited thereto.

It should be understood that, that the first metal layer conducts heat to the middle frame substrate body may be understood as: The first metal layer conducts partial high-temperature heat to the entire first metal layer and the middle frame substrate body. Heat is horizontally conducted to the entire first metal layer and is vertically conducted to the middle frame substrate body. Horizontal conduction and vertical conduction of heat are simultaneously performed, that is, the first metal layer is used to horizontally and vertically conduct heat. In other words, the first metal layer is used to conduct, to the entire first metal layer and the middle frame substrate body, the heat generated by at least one of the components that is in contact with or adjacent to the first metal layer.

Specific processing is not limited in this embodiment of the present disclosure provided that the passivated insulation layer can be formed in this embodiment of the present disclosure. For example, chemical conversion coating processing is performed on the surface of the first metal, or a polymer organic coating is sprayed on the surface of the first metal layer. This embodiment of the present disclosure is not limited thereto.

With reference to the first aspect and the foregoing implementation of the first aspect, in another implementation of the first aspect, the components in the electronic product include at least one of a printed circuit board (Printed Circuit Board, PCB), a chip, a battery, or a screen.

It should be understood that the components in this embodiment of the present disclosure may further include another component in the electronic product, for example, may further include components such as an antenna and a camera. This embodiment of the present disclosure is not limited thereto.

With reference to the first aspect and the foregoing implementation of the first aspect, in another implementation of the first aspect, the first metal layer includes any one of or a combination of the following items:

a copper layer, a silver layer, or a gold layer.

A thickness of the first metal layer is 0.01 to 50 micrometers.

Therefore, in this embodiment of the present disclosure, an overall heat-conducting capability of a die casting alloy body is improved by plating a layer of copper Cu, silver Ag, or gold Au with a high coefficient of heat conductivity on the surface. A coefficient of heat conductivity of copper Cu is 401 W/m·k, a coefficient of heat conductivity of silver Ag is 429 W/m·k, and a coefficient of heat conductivity of gold Au is 317 W/m·k. All the coefficients of heat conductivity are higher than a coefficient of heat conductivity of a middle frame substrate in an existing electronic product, and a better heat dissipation effect is provided.

With reference to the first aspect and the foregoing implementations of the first aspect, in another implementation of the first aspect, the first area includes an area that is of the middle frame substrate body and in which electricity is conducted, and the method further includes:

performing depassivation processing on the area that is in the first area and in which electricity is conducted, to expose the middle frame substrate body or the first metal layer.

With reference to the first aspect and the foregoing implementations of the first aspect, in another implementation of the first aspect, the area in which electricity is conducted includes a second area and/or a third area, the second area is used to electrically connect to a metal antenna spring plate in the electronic product, and the third area is used to connect to a grounded conductive component in the electronic product, to ground the middle frame member.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

With reference to the first aspect and the foregoing implementations of the first aspect, in another implementation of the first aspect, the method further includes:

electroplating a second metal layer in the second area of the middle frame substrate body, where an electrode potential difference between the second metal and the metal antenna spring plate is less than an electrode potential difference between the middle frame substrate body and the metal antenna spring plate.

It should be understood that, because different pieces of metal have different electrode potentials, there is galvanic corrosion between two different pieces of metal in contact with each other. A larger electrode potential difference between the two pieces of metal indicates severer galvanic corrosion. Second metal selected in this embodiment of the present disclosure meets a condition that the electrode potential difference between the second metal and the metal antenna spring plate is less than the electrode potential difference between the middle frame substrate body and the metal antenna spring plate. Therefore, galvanic corrosion between the second metal layer and the metal antenna spring plate is less than galvanic corrosion between the middle frame substrate body and the metal antenna spring plate, and when a material of the second metal layer is the same as a material of the metal antenna spring plate, that is, when the electrode potential difference between the second metal layer and the metal antenna spring plate is zero, galvanic corrosion can be avoided.

Therefore, in this embodiment of the present disclosure, the second metal layer whose electrode potential is the same as or is approximately the same as that of the metal antenna spring plate is electroplated in an area that is in contact with the gold-plated spring plate, so that galvanic corrosion can be prevented or reduced, and the middle frame member can be in fine contact with the gold-plated spring plate. Therefore, signal discontinuity is avoided, and user experience is improved.

With reference to the first aspect and the foregoing implementations of the first aspect, in another implementation of the first aspect, when a material of the metal antenna spring plate is gold, the second metal layer is a silver layer or a gold layer.

A thickness of the second metal layer is 0.01 to 50 micrometers.

In this embodiment of the present disclosure, galvanic corrosion can be prevented or reduced by plating gold or silver in an area that is in contact with the gold-plated spring plate, so that the middle frame member can be in fine contact with the gold-plated spring plate. Therefore, signal discontinuity is avoided, and user experience is improved.

With reference to the first aspect and the foregoing implementations of the first aspect, in another implementation of the first aspect, the method further includes:

electroplating a third metal layer in the third area of the middle frame substrate body, where a neutral salt spray corrosion resistance capability of the third metal layer is higher than that of the middle frame substrate body.

With reference to the first aspect and the foregoing implementations of the first aspect, in another implementation of the first aspect, the third metal layer is a gold layer or a silver layer. For example, a thickness of the third metal layer is 0.01 to 50 micrometers.

In this embodiment of the present disclosure, the third metal layer is plated in the grounded conductive area, so that the neutral salt spray corrosion resistance capability is enhanced, and user experience is improved.

It should be understood that the third metal layer may be another metal layer provided that neutral salt spray corrosion resistance performance of the third metal layer is higher than that of a middle frame basis. This embodiment of the present disclosure is not limited thereto.

With reference to the first aspect and the foregoing implementations of the first aspect, in another implementation of the first aspect, the middle frame substrate includes any one of or a combination of the following items:

die casting aluminum alloy, die casting magnesium alloy, die casting zinc alloy, or stainless steel.

With reference to the first aspect and the foregoing implementations of the first aspect, in another implementation of the first aspect, when the middle frame substrate is die casting magnesium alloy, before the electroplating a first metal layer in a first area of the middle frame substrate body, the method further includes:

performing activation processing and dip galvanization processing on the middle frame substrate body.

Correspondingly, the electroplating a first metal layer in a first area of the middle frame substrate body includes:

electroplating the first metal layer in the first area that undergoes dip galvanization processing.

With reference to the first aspect and the foregoing implementations of the first aspect, in another implementation of the first aspect, before the electroplating a first metal layer in a first area of the middle frame substrate body, the method further includes:

plating a metal transition layer in the first area, where both a capability of the metal transition layer to be bound with the middle frame substrate body and a capability of the metal transition layer to be bound with the first metal layer are higher than a capability of the middle frame substrate body to be bound with the first metal layer.

Correspondingly, the electroplating a first metal layer in a first area of the middle frame substrate body includes:

electroplating the first metal layer in the first area in which the metal transition layer is plated.

With reference to the first aspect and the foregoing implementations of the first aspect, in another implementation of the first aspect, a thickness of the metal transition layer is 0.01 to 20 micrometers.

With reference to the first aspect and the foregoing implementations of the first aspect, in another implementation of the first aspect, before the plating a metal transition layer in the first area, the method further includes:

performing sand blasting processing and/or impurity removing processing on the middle frame substrate body, to obtain the middle frame substrate body that undergoes sand blasting processing and/or impurity removing processing.

Correspondingly, the plating a metal transition layer in the first area includes:

plating the metal transition layer in the first area of the middle frame substrate body that undergoes sand blasting processing and/or impurity removing processing.

With reference to the first aspect and the foregoing implementations of the first aspect, in another implementation of the first aspect, the performing passivation processing on the first metal layer includes:

performing chemical conversion coating processing on the surface of the first metal, or spraying a polymer organic coating on the surface of the first metal layer.

According to a second aspect, a method for manufacturing a middle frame member is provided, where the middle frame member is a support part used inside an electronic product for supporting components in the electronic product, the middle frame member includes a middle frame substrate body and at least one metal-electroplated layer on a surface of the middle frame substrate body, and the method includes:

electroplating a second metal layer in a second area of the middle frame substrate body, where the second area is used to connect to a metal antenna spring plate in the electronic product, and an electrode potential difference between the second metal and the metal antenna spring plate is less than an electrode potential difference between the middle frame substrate body and the metal antenna spring plate.

Therefore, in this embodiment of the present disclosure, a second metal layer whose electrode potential is the same as or is approximately the same as that of a metal antenna spring plate is electroplated in an area that is in contact with the gold-plated spring plate, so that galvanic corrosion can be prevented or reduced, and a middle frame member can be in fine contact with the gold-plated spring plate. Therefore, signal discontinuity is avoided, and user experience is improved.

With reference to the second aspect, in an implementation of the second aspect, the components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

With reference to the second aspect and the foregoing implementation of the second aspect, in another implementation of the second aspect, when a material of the metal antenna spring plate is gold, the second metal layer is a silver layer or a gold layer.

A thickness of the second metal layer is 0.01 to 50 micrometers.

Therefore, in this embodiment of the present disclosure, galvanic corrosion can be prevented or reduced by plating gold or silver in an area that is in contact with the gold-plated spring plate, so that the middle frame member can be in fine contact with the gold-plated spring plate. Therefore, signal discontinuity is avoided, and user experience is improved.

With reference to the second aspect and the foregoing implementations of the second aspect, in another implementation of the second aspect, the method further includes:

electroplating a third metal layer in a third area of the middle frame substrate body, where the third area is used to connect to a grounded conductive component in the electronic product, to ground the middle frame member, and a neutral salt spray corrosion resistance capability of the third metal layer is higher than that of the middle frame substrate body.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

With reference to the second aspect and the foregoing implementations of the second aspect, in another implementation of the second aspect, the third metal layer is a gold layer or a silver layer.

A thickness of the third metal layer is 0.01 to 50 micrometers.

Therefore, in this embodiment of the present disclosure, the third metal layer is plated in the grounded conductive area, so that the neutral salt spray corrosion resistance capability is enhanced, and user experience is improved.

It should be understood that the third metal layer may be another metal layer provided that neutral salt spray corrosion resistance performance of the third metal layer is higher than that of a middle frame basis. This embodiment of the present disclosure is not limited thereto.

It should be noted that the second metal layer and the third metal layer in this embodiment of the present disclosure may be metal layers of a same type, and the second metal layer and the third metal layer may be simultaneously electroplated in this embodiment of the present disclosure.

According to a third aspect, a method for manufacturing a middle frame member is provided, where the middle frame member is a support part inside an electronic product for supporting components in the electronic product, the middle frame member includes a middle frame substrate body and at least one metal-electroplated layer on a surface of the middle frame substrate body, and the method includes:

electroplating a third metal layer in a third area of the middle frame substrate body, where the third area is used to connect to a grounded conductive component in the electronic product, to ground the middle frame member, and a neutral salt spray corrosion resistance capability of the third metal is higher than that of the middle frame substrate body.

Therefore, in this embodiment of the present disclosure, a third metal layer is plated in a grounded conductive area, so that a neutral salt spray corrosion resistance capability is enhanced, and user experience is improved.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

It should be understood that the third metal layer may be another metal layer provided that neutral salt spray corrosion resistance performance of the third metal layer is higher than that of a middle frame basis. This embodiment of the present disclosure is not limited thereto.

With reference to the third aspect, in an implementation of the third aspect, the components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

With reference to the third aspect and the foregoing implementation of the third aspect, in another implementation of the third aspect, the third metal layer is a gold layer or a silver layer, for example, a thickness of the third metal layer is 0.01 to 50 micrometers.

According to a fourth aspect, a middle frame member is provided, where the middle frame member is a support part inside an electronic product for supporting components in the electronic product, and the middle frame member includes:

a middle frame substrate body;

a first metal layer, attached to a first area of the middle frame substrate body, where a coefficient of heat conductivity of the first metal layer is greater than a coefficient of heat conductivity of the middle frame substrate body, the first area includes all or a part of an outer surface of the middle frame substrate body, and the first metal layer is used to conduct, to the middle frame substrate body, heat generated by at least one of the components that is in contact with or adjacent to the first metal layer; and a passivated insulation layer, attached to a surface of the first metal layer.

Therefore, in this embodiment of the present disclosure, first metal with a high coefficient of heat conductivity is attached to a first area of a middle frame substrate body, and a heat-conducting capability of the middle frame member is improved by using the first metal layer, so that heat of some components that emit a large amount of heat can be effectively conducted to the middle frame substrate body in time, and excessively high partial temperature is avoided. In addition, the middle frame substrate body can conduct, as soon as possible, the heat generated by the components in an electronic device, so that heat dissipation performance of the middle frame member is improved.

It should be understood that, that the first metal layer conducts heat to the middle frame substrate body may be understood as: The first metal layer conducts partial high-temperature heat to the entire first metal layer and the middle frame substrate body. Heat is horizontally conducted to the entire first metal layer and is vertically conducted to the middle frame substrate body. Horizontal conduction and vertical conduction of heat are simultaneously performed, that is, the first metal layer is used to horizontally and vertically conduct heat. In other words, the first metal layer is used to conduct, to the entire first metal layer and the middle frame substrate body, the heat generated by at least one of the components that is in contact with or adjacent to the first metal layer.

It should be understood that the middle frame member is a middle frame member generated according to any one of the first aspect or the implementations of the first aspect. For functions of components constituting the middle frame member, refer to features of the corresponding method in the first aspect and the implementations of the first aspect.

With reference to the fourth aspect and the foregoing implementation of the fourth aspect, in another implementation of the fourth aspect, the components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

With reference to the fourth aspect and the foregoing implementation of the fourth aspect, in another implementation of the fourth aspect, the first metal layer includes any one of or a combination of the following items:

a copper layer, a silver layer, or a gold layer. For example, a thickness of the first metal layer is 0.01 to 50 micrometers.

With reference to the fourth aspect and the foregoing implementations of the fourth aspect, in another implementation of the fourth aspect, the first area includes all or a part of the outer surface of the middle frame substrate body except an area in which electricity is conducted, and the first metal layer is attached to the area that is on the outer surface of the middle frame substrate body and in which electricity is conducted.

In other words, the first metal layer is specifically attached to the first area and the area in which electricity is conducted.

The passivated insulation layer is attached only to the surface of the first metal layer corresponding to the first area.

With reference to the fourth aspect and the foregoing implementations of the fourth aspect, in another implementation of the fourth aspect, the area in which electricity is conducted includes a second area and/or a third area, the second area is used to electrically connect to a metal antenna spring plate in the electronic product, and the third area is used to connect to a grounded conductive component in the electronic product, to ground the middle frame member.

With reference to the fourth aspect and the foregoing implementations of the fourth aspect, in another implementation of the fourth aspect, the middle frame member further includes:

a second metal layer, attached to the second area on the surface of the middle frame substrate body, where an electrode potential difference between the second metal layer and the metal antenna spring plate is less than an electrode potential difference between the middle frame substrate body and the metal antenna spring plate.

Therefore, in this embodiment of the present disclosure, the second metal layer whose electrode potential is the same as or is approximately the same as that of the metal antenna spring plate is attached to an area that is in contact with the gold-plated spring plate, so that galvanic corrosion can be prevented or reduced, and the middle frame member can be in fine contact with the gold-plated spring plate. Therefore, signal discontinuity is avoided, and user experience is improved.

With reference to the fourth aspect and the foregoing implementations of the fourth aspect, in another implementation of the fourth aspect, when a material of the metal antenna spring plate is gold, the second metal layer is a silver layer or a gold layer. For example, a thickness of the second metal layer is 0.01 to 50 micrometers.

Therefore, in this embodiment of the present disclosure, galvanic corrosion can be prevented or reduced by plating gold or silver in an area that is in contact with the gold-plated spring plate, so that the middle frame member can be in fine contact with the gold-plated spring plate. Therefore, signal discontinuity is avoided, and user experience is improved.

With reference to the fourth aspect and the foregoing implementations of the fourth aspect, in another implementation of the fourth aspect, the middle frame member further includes:

a third metal layer, attached to the third area on the surface of the middle frame substrate body, where a neutral salt spray corrosion resistance capability of the third metal layer is higher than that of the middle frame substrate body.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

With reference to the fourth aspect and the foregoing implementations of the fourth aspect, in another implementation of the fourth aspect, the third metal layer is a gold layer or a silver layer.

With reference to the fourth aspect and the foregoing implementations of the fourth aspect, in another implementation of the fourth aspect, the middle frame substrate includes any one of or a combination of the following items:

die casting aluminum alloy, die casting magnesium alloy, die casting zinc alloy, or stainless steel.

With reference to the fourth aspect and the foregoing implementations of the fourth aspect, in another implementation of the fourth aspect, when the middle frame substrate is die casting magnesium alloy, the middle frame member further includes:

a zinc layer, located between the first metal layer and the middle frame substrate body. For example, the zinc layer may be obtained after activation processing and dip galvanization processing are performed on the middle frame substrate body.

With reference to the fourth aspect and the foregoing implementations of the fourth aspect, in another implementation of the fourth aspect, the middle frame member further includes:

a metal transition layer, located between the first metal layer and the middle frame substrate body, where both a capability of the metal transition layer to be bound with the middle frame substrate body and a capability of the metal transition layer to be bound with the first metal layer are higher than a capability of the middle frame substrate body to be bound with the first metal layer.

With reference to the fourth aspect and the foregoing implementations of the fourth aspect, in another implementation of the fourth aspect, a thickness of the metal transition layer is 0.01 to 20 micrometers.

With reference to the fourth aspect and the foregoing implementations of the fourth aspect, in another implementation of the fourth aspect, the middle frame substrate body is a middle frame substrate body that undergoes sand blasting processing and/or impurity removing processing With reference to the fourth aspect and the foregoing implementations of the fourth aspect, in another implementation of the fourth aspect, the passivated insulation layer is obtained after chemical conversion coating processing is performed on the surface of the first metal or a polymer organic coating is sprayed on the surface of the first metal layer.

According to a fifth aspect, a middle frame member is provided, where the middle frame member is a support part inside an electronic product for supporting components in the electronic product, and the middle frame member includes:

a middle frame substrate body; and a second metal layer, attached to a second area on a surface of the middle frame substrate body, where the second area is used to connect to a metal antenna spring plate in the electronic product, and an electrode potential difference between the second metal layer and the metal antenna spring plate is less than an electrode potential difference between the middle frame substrate body and the metal antenna spring plate.

Therefore, in this embodiment of the present disclosure, a second metal layer whose electrode potential is the same as or is approximately the same as that of a metal antenna spring plate is attached to an area that is in contact with the gold-plated spring plate, so that galvanic corrosion can be prevented or reduced, and a middle frame member can be in fine contact with the gold-plated spring plate. Therefore, signal discontinuity is avoided, and user experience is improved.

It should be understood that the middle frame member is a middle frame member generated according to any one of the second aspect or the implementations of the second aspect. For functions of components constituting the middle frame member, refer to features of the corresponding method in the second aspect and the implementations of the second aspect.

With reference to the fifth aspect, in an implementation of the fifth aspect, the components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

With reference to the fifth aspect and the foregoing implementation of the fifth aspect, in another implementation of the fifth aspect, when a material of the metal antenna spring plate is gold, the second metal layer is a silver layer or a gold layer. For example, a thickness of the second metal layer is 0.01 to 50 micrometers.

Therefore, in this embodiment of the present disclosure, galvanic corrosion can be prevented or reduced by disposing a gold layer or a silver layer in an area that is in contact with the gold-plated spring plate, so that the middle frame member can be in fine contact with the gold-plated spring plate. Therefore, signal discontinuity is avoided, and user experience is improved.

With reference to the fifth aspect and the foregoing implementations of the fifth aspect, in another implementation of the fifth aspect, the middle frame member further includes:

a third metal layer, attached to a third area on the surface of the middle frame substrate body, where the third area is connected to a grounded conductive component in the electronic product, to ground the middle frame member, and a neutral salt spray corrosion resistance capability of the third metal layer is higher than that of the middle frame substrate body.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

With reference to the fifth aspect and the foregoing implementations of the fifth aspect, in another implementation of the fifth aspect, the third metal layer is a gold layer or a silver layer. For example, a thickness of the third metal layer is 0.01 to 50 micrometers.

Therefore, in this embodiment of the present disclosure, the third metal layer is disposed in the grounded conductive area, so that the neutral salt spray corrosion resistance capability is enhanced, and user experience is improved.

It should be understood that the third metal layer may be another metal layer provided that neutral salt spray corrosion resistance performance of the third metal layer is higher than that of a middle frame basis. This embodiment of the present disclosure is not limited thereto.

It should be noted that the second metal layer and the third metal layer in this embodiment of the present disclosure may be metal layers of a same type, and the second metal layer and the third metal layer may be simultaneously electroplated in this embodiment of the present disclosure.

According to a sixth aspect, a middle frame member is provided, where the middle frame member is a support part inside an electronic product for supporting components in the electronic product, and the middle frame member includes:

a middle frame substrate body; and a third metal layer, attached to a third area on a surface of the middle frame substrate body, where the third area is used to connect to a grounded conductive component in the electronic product, to ground the middle frame member, and a neutral salt spray corrosion resistance capability of the third metal layer is higher than that of the middle frame substrate body.

Therefore, in this embodiment of the present disclosure, a third metal layer is disposed in a grounded conductive area, so that a neutral salt spray corrosion resistance capability is enhanced, and user experience is improved.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

It should be understood that the third metal layer may be another metal layer provided that neutral salt spray corrosion resistance performance of the third metal layer is higher than that of a middle frame basis. This embodiment of the present disclosure is not limited thereto.

It should be understood that the middle frame member is a middle frame member generated according to any one of the third aspect or the implementations of the third aspect. For functions of components constituting the middle frame member, refer to features of the corresponding method in the third aspect and the implementations of the third aspect. For brevity, details are not described herein.

With reference to the sixth aspect, in an implementation of the sixth aspect, the components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

With reference to the sixth aspect and the foregoing implementation of the sixth aspect, in another implementation of the sixth aspect, the third metal layer is a gold layer or a silver layer.

A thickness of the third metal layer is 0.01 to 50 micrometers.

According to a seventh aspect, an electronic product is provided, including:

the middle frame member according to any one of the fourth aspect to the sixth aspect or the implementations of the fourth aspect to the sixth aspect, components, and a housing, where the components are accommodated in the housing, the middle frame member is configured to support the components, and the middle frame member and the housing are assembled together.

With reference to the seventh aspect, in an implementation of the seventh aspect, the components include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

Therefore, in the embodiments of the present disclosure, first metal with a high coefficient of heat conductivity is electroplated in a first area of a middle frame substrate body, and a heat-conducting capability of the middle frame member is improved by using the first metal layer, so that heat of some components that emit a large amount of heat can be effectively conducted to the middle frame substrate body in time, and excessively high partial temperature is avoided. In addition, the middle frame substrate body can conduct, as soon as possible, the heat generated by the components in an electronic device, so that heat dissipation performance of the middle frame member is improved.

BRIEF DESCRIPTION OF DRAWINGS

To describe the technical solutions in embodiments of the present disclosure more clearly, the following briefly describes the accompanying drawings required for describing the embodiments of the present disclosure. Apparently, the accompanying drawings in the following description show merely some embodiments of the present disclosure, and persons of ordinary skill in the art may still derive other drawings from these accompanying drawings without creative efforts.

FIG. 1 is a schematic flowchart of a method for manufacturing a middle frame member according to an embodiment of the present disclosure.

FIG. 2 is a schematic flowchart of a method for manufacturing a middle frame member according to another embodiment of the present disclosure.

DESCRIPTION OF EMBODIMENTS

Figure 3:
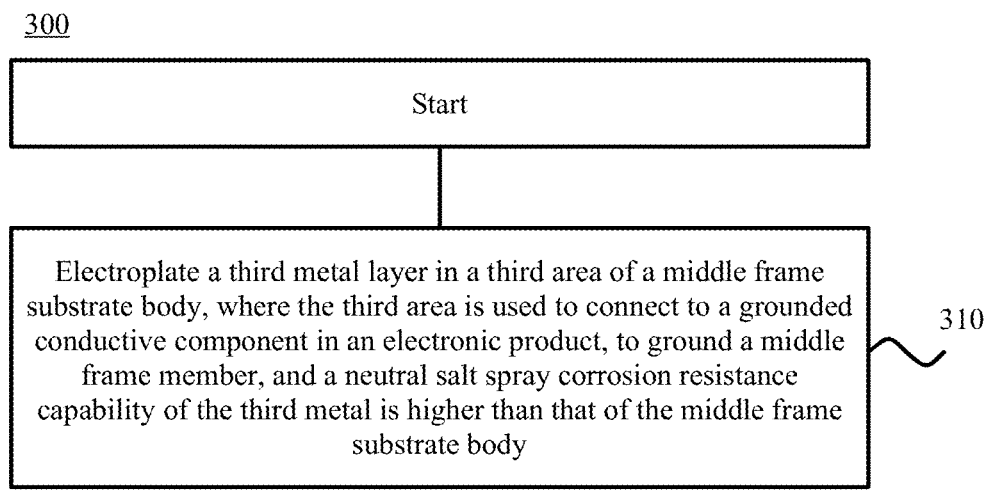
FIG. 3 is a schematic flowchart of a method for manufacturing a middle frame member according to another embodiment of the present disclosure.

The following clearly describes the technical solutions in the embodiments of the present disclosure with reference to accompanying drawings in the embodiments of the present disclosure. Apparently, the described embodiments are a part rather than all of the embodiments of the present disclosure. All other embodiments obtained by persons of ordinary skill in the art based on the embodiments of the present disclosure without creative efforts shall fall within the protection scope of the present disclosure.

It should be understood that a middle frame member in the embodiments of the present disclosure is a support part inside an electronic product for supporting components in the electronic product. In other words, the middle frame member may be used for fastening, placing, accommodating, or supporting the components in the electronic product. For example, the middle frame member may be a support part used for placing a PCB board, a chip, or a battery in the electronic product, or the middle frame member is a support part used for supporting a screen of the electronic product. The electronic product may also be referred to as an electronic device or a terminal, and may include but is not limited to a mobile phone, a mobile computer, a tablet (portable android device, Pad), a personal digital assistant (PDA), a media player, a smart TV, a smartwatch, smart glasses, a smart band, an ebook, a mobile station, and the like. The middle frame member may be a middle frame or a front cover of a mobile phone, a screen support board of a mobile phone, a front cover or a screen support board of a Pad or a computer, or the like. The embodiments of the present disclosure are not limited thereto.

It should be understood that, a specific shape of the middle frame member is not limited in an example of the present disclosure, and the shape of the middle frame member may be determined according to an actual use status. For example, the middle frame member may include at least one convex part or concave part, or include at least one hole. In addition, a specific shape of a metal layer on a surface of a middle frame substrate body is not limited in the embodiments of the present disclosure either, and the specific shape of the metal layer may be determined according to an actual use status.

FIG. 1 is a schematic block diagram of a method for manufacturing a middle frame member according to an embodiment of the present disclosure. The middle frame member is a support part used for supporting components in the electronic product, and the middle frame member includes a middle frame substrate body and at least one metal-electroplated layer on a surface of the middle frame substrate body. A method 100 shown in FIG. 1 includes the following blocks:

110. Electroplate a first metal layer in a first area of the middle frame substrate body, where a coefficient of heat conductivity of the first metal layer is greater than a coefficient of heat conductivity of the middle frame substrate body, the first area includes all or a part of an outer surface of the middle frame substrate body, and the first metal layer is used to conduct, to the middle frame substrate body, heat generated by at least one of the components that is in contact with or adjacent to the first metal layer.

120. Perform passivation processing on the first metal layer, so that a passivated insulation layer used for resisting corrosion is formed on a surface of the first metal layer.

Therefore, in this embodiment of the present disclosure, first metal with a high coefficient of heat conductivity is electroplated in a first area of a middle frame substrate body, and a heat-conducting capability of the middle frame member is improved by using the first metal layer, so that heat of some components that emit a large amount of heat can be effectively conducted to the middle frame substrate body in time, and excessively high partial temperature is avoided. In addition, the middle frame substrate body can conduct, as soon as possible, the heat generated by the components in an electronic device, so that heat dissipation performance of the middle frame member is improved.

It should be understood that the first area in this example of the present disclosure may be all or a part of the outer surface of the middle frame substrate body. For example, when the first area is all the middle frame substrate body, etching is subsequently performed on a grounded conductive area and an area that is in contact with a metal spring plate, to expose the substrate body or first metal for subsequent processing. The first area may not include the grounded conductive area and the area that is in contact with the metal spring plate, and the first metal layer is electroplated in another area, to improve a heat-conducting property of the middle frame member. Alternatively, the first area may include only an area corresponding to a part that emits a relatively large amount of heat in the electronic product. For example, the first area may include only an area that emits a relatively large amount of heat, such as a camera area or a CPU area. The first metal layer is electroplated in this area, to improve a heat-conducting property of the middle frame member. Alternatively, the first area may include only a second area and/or a third area mentioned below, that is, the first metal layer may be electroplated before a second metal layer and a third metal layer are electroplated in the second area and the third area. This embodiment of the present disclosure is not limited thereto.

It should be understood that, that the first metal layer conducts heat to the middle frame substrate body may be understood as: The first metal layer conducts partial high-temperature heat to the entire first metal layer and the middle frame substrate body. Heat is horizontally conducted to the entire first metal layer and is vertically conducted to the middle frame substrate body. Horizontal conduction and vertical conduction of heat are simultaneously performed, that is, the first metal layer is used to horizontally and vertically conduct heat. In other words, the first metal layer is used to conduct, to the entire first metal layer and the middle frame substrate body, the heat generated by at least one of the components that is in contact with or adjacent to the first metal layer.

Optionally, in another embodiment, the components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

Optionally, in another embodiment, the first metal layer includes any one of or a combination of the following items: a copper layer, a silver layer, or a gold layer.

For example, a thickness of the first metal layer is 0.01 to 50 micrometers. For example, the thickness of the first metal layer may be 5 micrometers, 10 micrometers, 15 micrometers, 20 micrometers, or the like. This embodiment of the present disclosure is not limited thereto.

Therefore, in this embodiment of the present disclosure, an overall heat-conducting capability of a die casting alloy body is improved by plating a layer of copper (Cu), silver (Ag), or gold (Au) with a high coefficient of heat conductivity on the surface. A coefficient of heat conductivity of copper Cu is 401 W/m·k, a coefficient of heat conductivity of silver Ag is 429 W/m·k, and a coefficient of heat conductivity of gold Au is 317 W/m·k. All the coefficients of heat conductivity are higher than a coefficient of heat conductivity of a middle frame substrate in an existing electronic product, and a better heat dissipation effect is provided.

Optionally, in another embodiment, the middle frame substrate includes any one of or a combination of the following items: die casting aluminum alloy, die casting magnesium alloy, die casting zinc alloy, or stainless steel.

For example, the middle frame substrate may be ADC12 die casting aluminum alloy, AZ91D die casting magnesium alloy, ZA3 die casting zinc alloy, die casting aluminum and zinc alloy, die casting aluminum and magnesium alloy, stamped stainless steel, or the like. This embodiment of the present disclosure is not limited thereto.

It should be understood that, in block 120, specific processing is not limited in this embodiment of the present disclosure provided that the passivated insulation layer can be formed in this embodiment of the present disclosure. For example, in block 120, chemical conversion coating processing is performed on the surface of the first metal, or a polymer organic coating is sprayed on the surface of the first metal layer. This embodiment of the present disclosure is not limited thereto.

Optionally, in another embodiment, the first area includes an area that is of the middle frame substrate body and in which electricity is conducted, and the method further includes:

performing depassivation processing on the area that is in the first area and in which electricity is conducted, to expose the middle frame substrate body or the first metal layer.

After depassivation processing, the insulation layer is removed, and the middle frame substrate body or the first metal layer is exposed, so that the middle frame substrate body or the first metal layer can be electrically conductive to another component in the electronic product.

It should be understood that, in this embodiment of the present disclosure, depassivation processing may be performed by means of laser etching, or depassivation processing may be performed in another manner, such as a mechanical method. This is not limited in this embodiment of the present disclosure.

Further, in another embodiment, the area in which electricity is conducted includes a second area and/or a third area. The second area is used to electrically connect to a metal antenna spring plate in the electronic product, and the third area is used to connect to a grounded conductive component in the electronic product, to ground the middle frame member.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

Further, in another embodiment, the method further includes: electroplating a second metal layer in the second area of the middle frame substrate body. An electrode potential difference between the second metal and the metal antenna spring plate is less than an electrode potential difference between the middle frame substrate body and the metal antenna spring plate.

It should be understood that, because different pieces of metal have different electrode potentials, there is galvanic corrosion between two different pieces of metal in contact with each other. A larger electrode potential difference between the two pieces of metal indicates severer galvanic corrosion. Second metal selected in this embodiment of the present disclosure meets a condition that the electrode potential difference between the second metal and the metal antenna spring plate is less than the electrode potential difference between the middle frame substrate body and the metal antenna spring plate. Therefore, galvanic corrosion between the second metal layer and the metal antenna spring plate is less than galvanic corrosion between the middle frame substrate body and the metal antenna spring plate, and when a material of the second metal layer is the same as a material of the metal antenna spring plate, that is, when the electrode potential difference between the second metal layer and the metal antenna spring plate is zero, galvanic corrosion can be avoided.

Therefore, in this embodiment of the present disclosure, the second metal layer whose electrode potential is the same as or is approximately the same as that of the metal antenna spring plate is electroplated in an area that is in contact with the gold-plated spring plate, so that galvanic corrosion can be prevented or reduced, and the middle frame member can be in fine contact with the gold-plated spring plate. Therefore, signal discontinuity is avoided, and user experience is improved.

Further, in another embodiment, when a material of the metal antenna spring plate is gold, the second metal layer is a silver layer or a gold layer. For example, a thickness of the second metal layer is 0.01 to 50 micrometers.

It should be noted that, in a technology for enabling a frequently-used material such as die casting aluminum alloy, die casting magnesium alloy, or die casting zinc alloy of an existing middle frame to be in contact with a gold-plated antenna spring plate, signal continuity of an electronic product such as a mobile phone is ensured. Currently, there is an electrode potential difference between a die casting middle frame member such as aluminum alloy, magnesium alloy, or zinc alloy and a gold element of the gold-plated spring plate. Consequently, galvanic corrosion is caused, the gold-plated spring plate cannot be in fine contact with the middle frame of the electronic product such as a mobile phone as a result of corrosion, signal discontinuity is caused, and use of a consumer is affected.

In this embodiment of the present disclosure, galvanic corrosion can be prevented or reduced by plating gold or silver in an area that is in contact with the gold-plated spring plate, so that the middle frame member can be in fine contact with the gold-plated spring plate. Therefore, signal discontinuity is avoided, and user experience is improved.

It should be understood that, in this embodiment of the present disclosure, the second metal layer may be plated in the second area in at least two cases. In a first case, when the first area includes the second area, depassivation processing is performed first, and then the second metal layer is plated. In a second case, the first area does not include the second area. Because the first metal layer is not plated in the second area, in this case, the second metal layer is directly electroplated in the second area.

Optionally, in another embodiment, the method further includes:

electroplating a third metal layer in the third area of the middle frame substrate body, where a neutral salt spray corrosion resistance capability of the third metal layer is higher than that of the middle frame substrate body.

Further, in another embodiment, the third metal layer is a gold layer or a silver layer. For example, a thickness of the third metal layer is 0.01 to 50 micrometers.

It should be noted that an existing middle frame material, especially die casting aluminum alloy or die casting magnesium alloy, has insufficient corrosion resistance performance. Particularly, when a surface of an original substrate in some areas of a mobile phone middle frame is exposed by means of laser etching for grounded electric conduction, there is a risk of not resisting neutral salt spray corrosion.

In this embodiment of the present disclosure, the third metal layer is plated in the grounded conductive area, so that the neutral salt spray corrosion resistance capability is enhanced, and user experience is improved.

It should be understood that the third metal layer may be another metal layer provided that neutral salt spray corrosion resistance performance of the third metal layer is higher than that of a middle frame basis. This embodiment of the present disclosure is not limited thereto.

It should be noted that the second metal layer and the third metal layer in this embodiment of the present disclosure may be metal layers of a same type, and the second metal layer and the third metal layer may be simultaneously electroplated in this embodiment of the present disclosure.

When the first area includes the second area and the third area, in this embodiment of the present disclosure, depassivation processing may be first performed at positions in the first area that are corresponding to the second area and the third area, to expose the substrate body or the first metal layer, and then the second metal layer and the third metal layer are electroplated. The second area and the third area may be different areas, and the second area and the third area do not coincide with each other.

Optionally, in another embodiment, when the middle frame substrate is die casting magnesium alloy, before the electroplating a first metal layer in a first area of the middle frame substrate body, the method further includes:

performing activation processing and dip galvanization processing on the middle frame substrate body.

Correspondingly, in block 110, the first metal layer is electroplated in the first area that undergoes dip galvanization processing.

Specifically, because the die casting magnesium alloy is extremely active, to simulate corrosion of the middle frame substrate, in this embodiment of the present disclosure, activation processing is first performed on the middle frame member in a fluoride solution, and then a dip galvanization operation is performed. A thickness of a zinc layer may be 3 micrometers, 5 micrometers, 10 micrometers, or the like. This is not limited in this embodiment of the present disclosure. The first metal layer is electroplated after dip galvanization in this embodiment of the present disclosure.

Optionally, in another embodiment, before block 110, the method may further include:

plating a metal transition layer in the first area, where both a capability of the metal transition layer to be bound with the middle frame substrate body and a capability of the metal transition layer to be bound with the first metal layer are higher than a capability of the middle frame substrate body to be bound with the first metal layer.

Correspondingly, in block 110, the first metal layer is electroplated in the first area in which the metal transition layer is plated.

Further, in another embodiment, a thickness of the metal transition layer is 0.01 to 20 micrometers.

Specifically, before the first metal layer is electroplated, in the method in this embodiment of the present disclosure, the metal transition layer may be plated first. The metal transition layer can play a role of transition, so that the first metal layer can be subsequently electroplated more easily.

It should be understood that a material of the metal transition layer is not limited in this embodiment of the present disclosure provided that both the capability of the metal transition layer to be bound with the middle frame substrate body and the capability of the metal transition layer to be bound with the first metal layer are higher than the capability of the middle frame substrate body to be bound with the first metal layer. For example, the material of the metal transition layer may be nickel. This embodiment of the present disclosure is not limited thereto.

Further, in another embodiment, before block 110, the method further includes:

performing sand blasting processing and/or impurity removing processing on the middle frame substrate body, to obtain the middle frame substrate body that undergoes sand blasting processing and/or impurity removing processing.

Correspondingly, the plating a metal transition layer in the first area includes:

plating the metal transition layer in the first area of the middle frame substrate body that undergoes sand blasting processing and/or impurity removing processing.

Specifically, before the middle frame member body is obtained, in this embodiment of the present disclosure, sand blasting processing and/or impurity removing processing may be performed first, then the metal transition layer is plated, and finally processing such as electroplating the first metal layer is performed.

For example, in this embodiment of the present disclosure, slight sand blasting processing may be performed on the middle frame substrate body, to remove dirt such as a decoating agent on the surface and improve density of the surface, so as to subsequently improve a binding force between the substrate and a coating layer.

Then, degreasing processing, alkaline etching processing, and acid etching processing are performed on the middle frame, to remove surface oxide and another surface impurity on the middle frame member, so that a fresh substrate surface is exposed, and subsequent metal layer plating is facilitated.

It should be noted that, in the prior art, for example, ADC12 die casting aluminum alloy is used, a chemical conversion coating is covered on the die casting aluminum alloy, and areas are distinguished by means of laser etching for grounded electric conduction or coming in contact with the gold-plated spring plate. However, in the prior art, after a related substrate area is exposed by means of laser etching, there is a problem of not resisting neutral salt spray corrosion, and poor grounding may be caused. Severe galvanic corrosion is caused when the ADC12 aluminum alloy is in direct contact with the gold-plated spring plate or the gold-plated spring plate is directly disposed on the ADC12 aluminum alloy.

For the foregoing problem, in this embodiment of the present disclosure, a chemical conversion coating may be covered first, then etching is performed on a grounded conductive area and/or an area that is in contact with a gold-plated spring plate, and finally metal is plated to reduce galvanic corrosion and/or neutral salt spray corrosion. Detailed descriptions are provided below with reference to FIG. 2 and FIG. 3.

FIG. 2 is a schematic block diagram of a method for manufacturing a middle frame member according to another embodiment of the present disclosure. The middle frame member is a support part used inside an electronic product for supporting components in the electronic product, and the middle frame member includes a middle frame substrate body and at least one metal-electroplated layer on a surface of the middle frame substrate body. A method 200 shown in FIG. 2 includes the following block:

210. Electroplate a second metal layer in a second area of the middle frame substrate body, where the second area is used to connect to a metal antenna spring plate in the electronic product, and an electrode potential difference between the second metal and the metal antenna spring plate is less than an electrode potential difference between the middle frame substrate body and the metal antenna spring plate.

It should be understood that, because different pieces of metal have different electrode potentials, there is galvanic corrosion between two different pieces of metal in contact with each other. A larger electrode potential difference between the two pieces of metal indicates severer galvanic corrosion. Second metal selected in this embodiment of the present disclosure meets a condition that the electrode potential difference between the second metal and the metal antenna spring plate is less than the electrode potential difference between the middle frame substrate body and the metal antenna spring plate. Therefore, galvanic corrosion between the second metal layer and the metal antenna spring plate is less than galvanic corrosion between the middle frame substrate body and the metal antenna spring plate, and when a material of the second metal layer is the same as a material of the metal antenna spring plate, that is, when the electrode potential difference between the second metal layer and the metal antenna spring plate is zero, galvanic corrosion can be avoided.

Therefore, in this embodiment of the present disclosure, a second metal layer whose electrode potential is the same as or is approximately the same as that of a metal antenna spring plate is electroplated in an area that is in contact with the gold-plated spring plate, so that galvanic corrosion can be prevented or reduced, and a middle frame member can be in fine contact with the gold-plated spring plate. Therefore, signal discontinuity is avoided, and user experience is improved.

Optionally, in another embodiment, the components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

Optionally, in another embodiment, a material of the metal antenna spring plate is gold, and the second metal layer is a silver layer or a gold layer. For example, a thickness of the second metal layer is 0.01 to 50 micrometers.

Therefore, in this embodiment of the present disclosure, galvanic corrosion can be prevented or reduced by plating gold or silver in an area that is in contact with the gold-plated spring plate, so that the middle frame member can be in fine contact with the gold-plated spring plate. Therefore, signal discontinuity is avoided, and user experience is improved.

Optionally, in another embodiment, the method further includes:

electroplating a third metal layer in a third area of the middle frame substrate body, where the third area is used to connect to a grounded conductive component in the electronic product, to ground the middle frame member, and a neutral salt spray corrosion resistance capability of the third metal layer is higher than that of the middle frame substrate body.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

Further, in another embodiment, the third metal layer is a gold layer or a silver layer. For example, a thickness of the third metal layer is 0.01 to 50 micrometers.

Therefore, in this embodiment of the present disclosure, the third metal layer is plated in the grounded conductive area, so that the neutral salt spray corrosion resistance capability is enhanced, and user experience is improved.

It should be understood that the third metal layer may be another metal layer provided that neutral salt spray corrosion resistance performance of the third metal layer is higher than that of a middle frame basis. This embodiment of the present disclosure is not limited thereto.

It should be noted that the second metal layer and the third metal layer in this embodiment of the present disclosure may be metal layers of a same type, and the second metal layer and the third metal layer may be simultaneously electroplated in this embodiment of the present disclosure.

FIG. 3 is a schematic block diagram of a method for manufacturing a middle frame member according to another embodiment of the present disclosure. The middle frame member is a support part inside an electronic product for supporting components in the electronic product, and the middle frame member includes a middle frame substrate body and at least one metal-electroplated layer on a surface of the middle frame substrate body. A method 300 shown in FIG. 3 includes the following block:

310. Electroplate a third metal layer in a third area of the middle frame substrate body, where the third area is used to connect to a grounded conductive component in the electronic product, to ground the middle frame member, and a neutral salt spray corrosion resistance capability of the third metal is higher than that of the middle frame substrate body.

Optionally, in another embodiment, the components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

Further, in another embodiment, the third metal layer is a gold layer or a silver layer. For example, a thickness of the third metal layer is 0.01 to 50 micrometers.

Therefore, in this embodiment of the present disclosure, a third metal layer is plated in a grounded conductive area, so that a neutral salt spray corrosion resistance capability is enhanced, and user experience is improved.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

It should be understood that the third metal layer may be another metal layer provided that neutral salt spray corrosion resistance performance of the third metal layer is higher than that of a middle frame basis. This embodiment of the present disclosure is not limited thereto.

It should be noted that, in this embodiment of the present disclosure, to ensure a heat-conducting property of a copper-plated layer, the copper-plated layer is pure copper and pure copper with few impurity elements, and content of copper at the copper-plated layer may be 97% or more than 97%. To ensure electrical conductivity and galvanic corrosion resistance performance of silver or gold, purity of a gold-plated layer or a silver-plated layer may be 97% or more than 97%. However, this embodiment of the present disclosure is not limited thereto.

It should be noted that, in this embodiment of the present disclosure, a copper plating process is not limited and may be cyanide copper plating, acid copper plating, pyrophosphate copper plating, cyanide-free copper plating, or the like. A silver plating process is not limited and may be cyanide silver plating or cyanide-free silver plating. A gold plating process is not limited and may be alkaline cyanide gold plating, acidic and neutral gold plating, sulphite gold plating, gold plating by using gold potassium citrate, or the like.

The foregoing describes in detail the method for manufacturing a middle frame member according to the embodiments of the present disclosure with reference to FIG. 1 to FIG. 3. It should be noted that examples in FIG. 1 to FIG. 3 are merely intended to help persons skilled in the art understand the embodiments of the present disclosure instead of limiting the embodiments of the present disclosure to a specific value or a specific scenario shown in the examples. Apparently, persons skilled in the art can make various equivalent modifications or variations according to the examples in FIG. 1 to FIG. 3, for example, properly change a metal layer thickness or a metal material, or properly reduce some unnecessary actions. Such modifications or variations also fall within the scope of the embodiments of the present disclosure. The following describes in detail a method for manufacturing a middle frame member according to the embodiments of the present disclosure with reference to specific examples in FIG. 4 to FIG. 10. It should be noted that descriptions in FIG. 4 to FIG. 10 are merely examples. According to specific actual situations, some blocks or processes in the examples in FIG. 4 to FIG. 10 may be omitted in actual application. The embodiments of the present disclosure are not limited thereto.

Figure 4:
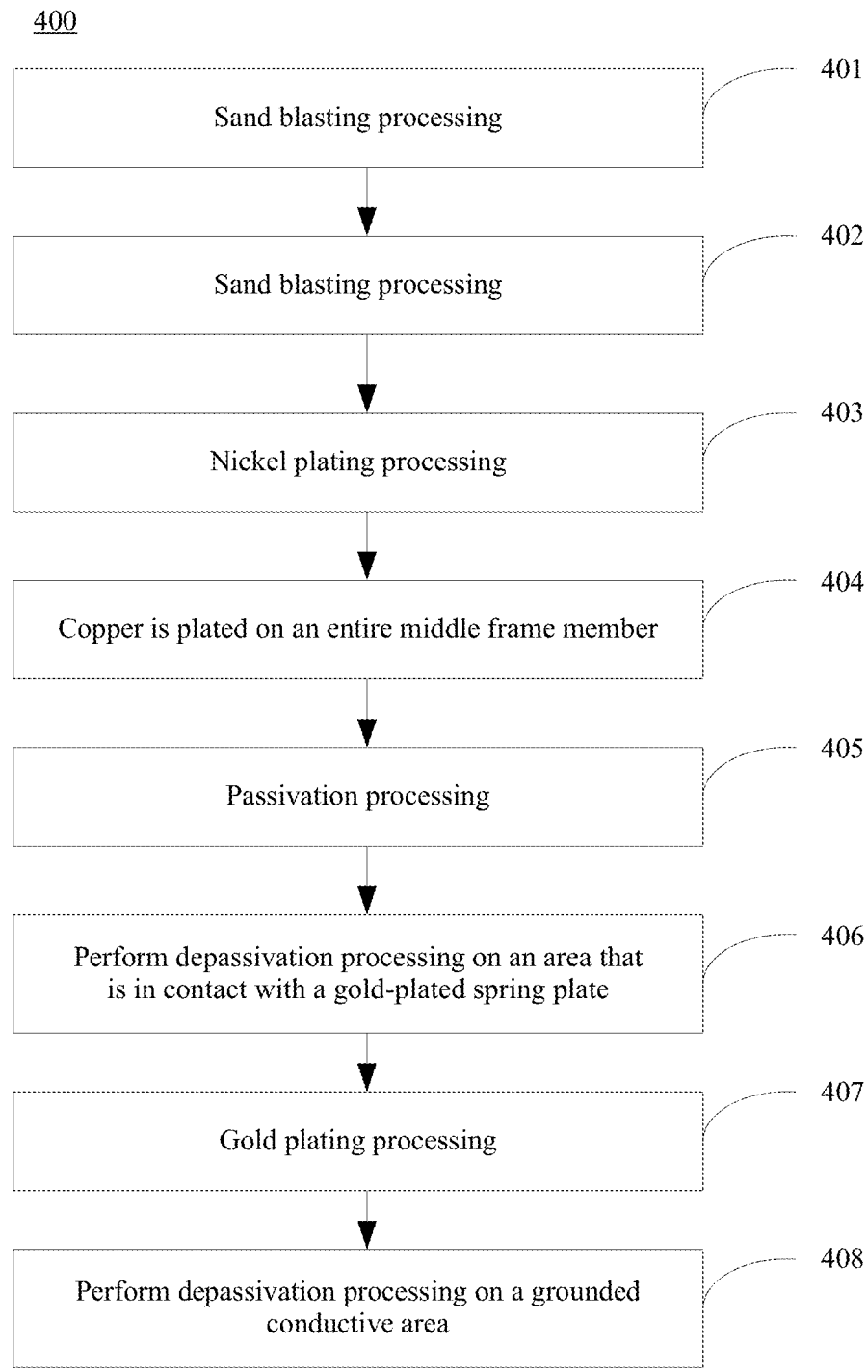
FIG. 4 is a schematic flowchart of a method for manufacturing a middle frame member according to another embodiment of the present disclosure.

FIG. 4 is a schematic block diagram of a method for manufacturing a middle frame member according to another embodiment of the present disclosure. A substrate of the middle frame member shown in FIG. 4 may be a mobile phone middle frame made of ADC12 die casting aluminum alloy. In the method in FIG. 4, sand blasting processing and impurity removing processing are performed first, then copper is plated (a first metal layer is plated) on the entire middle frame member after nickel is plated (a metal transition layer is plated) on the entire middle frame member, then passivation is performed, and then depassivation is performed on some areas (a grounded conductive area and an area that is in contact with a gold-plated metal spring plate), and finally gold is plated (a second metal layer is plated) in the area (a second area) that is in contact with the gold-plated metal spring plate. Specifically, a method 400 shown in FIG. 4 includes the following blocks:

401. Perform slight sand blasting processing on ADC12 aluminum alloy, to remove dirt such as a decoating agent on a surface and improve density of the surface, so as to subsequently improve a binding force between a substrate and a coating layer.

402. Perform degreasing processing, alkaline etching processing, and acid etching processing on the middle frame, to remove surface oxide and another surface impurity on the middle frame member, so as to expose a fresh substrate surface.

403. Perform chemical nickel plating processing on the middle frame member, where a thickness is 4 micrometers.

In other words, a nickel layer herein is the foregoing metal transition layer.

404. Electroplate Cu on the middle frame member, where a thickness is 15 micrometers.

405. Perform chemical conversion passivation processing on the middle frame member on which Cu is electroplated.

406. Perform laser etching on a part that is in contact with a gold-plated metal spring plate, to remove a thickness of a passivated part or a Ni-plated layer.

407. Perform a gold-plating operation on a laser-etched area.

408. Perform laser etching on a grounded conductive area, to remove a passivated layer, so as to expose a Ni-plated layer or the substrate.

It should be noted that, because a neutral salt spray corrosion resistance capability of Cu is lower than that of the substrate made of the ADC12 die casting aluminum alloy, the Ni-plated layer or the substrate is exposed in block 408, and exposure of a Cu layer is avoided.

According to the foregoing process, a copper-plated layer with high heat conductivity and a gold-plated layer with high electrical conductivity are formed on a mobile phone middle frame made of ADC12 die casting aluminum alloy. It can be learned after actual detection that, after heat dissipation, temperature of a chip area of the middle frame member that undergoes electroplating is at least 1 degree Celsius lower than temperature of ADC12, no middle frame corrosion phenomenon occurs in a 24-hour neutral salt spray experiment, no corrosion phenomenon occurs in an area that is in contact with the gold-plated layer and that is of a gold-plated spring plate through which a radio frequency signal passes, and no signal problem caused by middle frame corrosion or galvanic corrosion generated due to contact between the middle frame and the spring plate occurs in the mobile phone.

Figure 5:
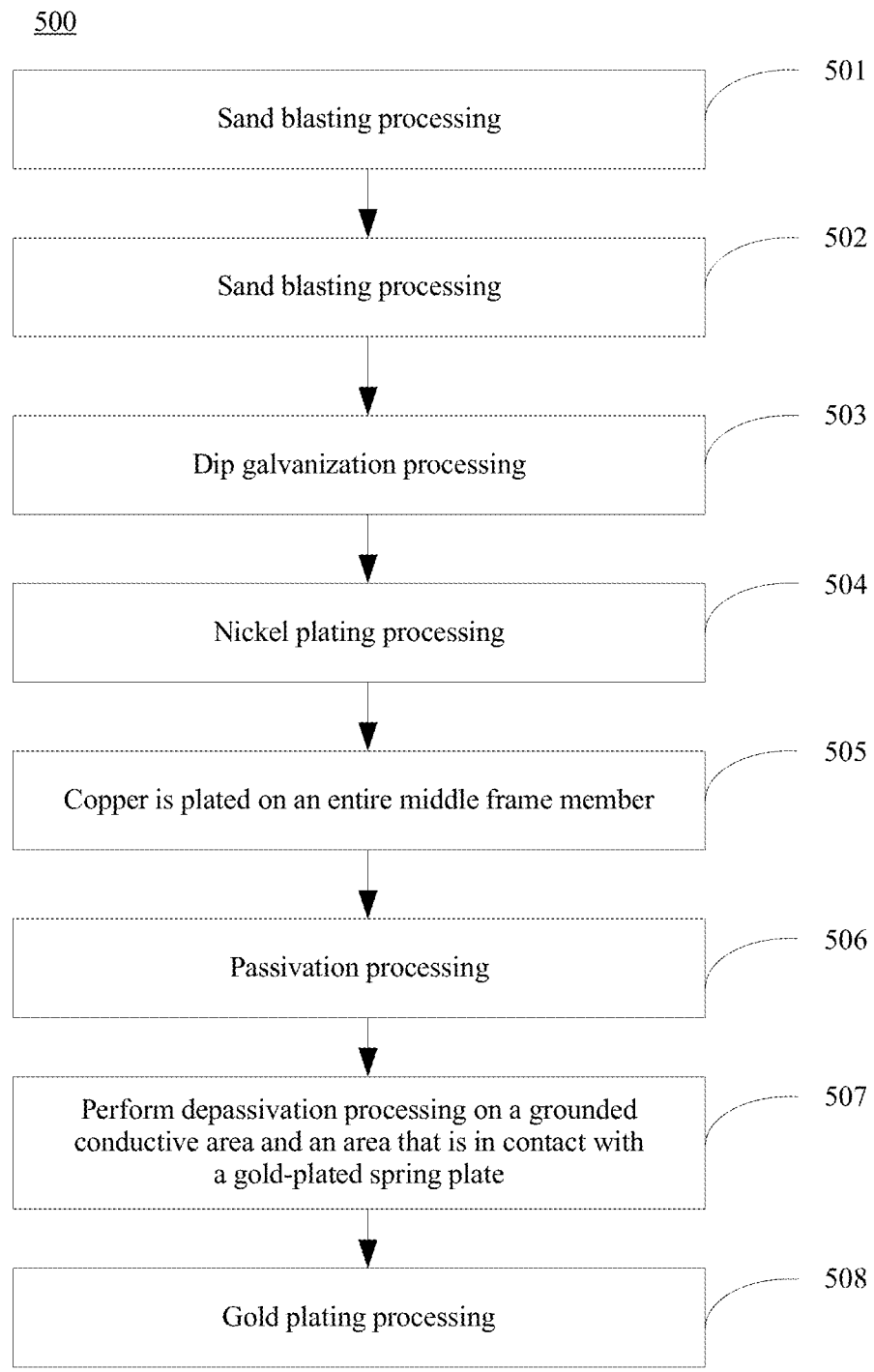
FIG. 5 is a schematic flowchart of a method for manufacturing a middle frame member according to another embodiment of the present disclosure.

FIG. 5 is a schematic block diagram of a method for manufacturing a middle frame member according to another embodiment of the present disclosure. A substrate of the middle frame member shown in FIG. 5 may be a mobile phone middle frame made of AZ91D die casting magnesium alloy. In the method in FIG. 5, sand blasting processing and impurity removing processing are performed first, then dip galvanization processing is performed on the entire middle frame member, then copper is plated (a first metal layer is plated) on the entire middle frame member after nickel is plated (a metal transition layer is plated) on the entire middle frame member, then passivation is performed, and then depassivation is performed on some areas (a grounded conductive area and an area that is in contact with a gold-plated metal spring plate), and finally gold is plated (a second metal layer and a third metal layer are plated) in the grounded conductive area (a third area) and the area (a second area) that is in contact with the gold-plated metal spring plate.

Specifically, a method 500 shown in FIG. 5 includes the following blocks:

501. Perform slight sand blasting processing on AZ91D die casting magnesium alloy, to remove dirt such as a decoating agent on a surface and improve density of the surface, so as to subsequently improve a binding force between a substrate and a coating layer.

502. Perform degreasing processing, alkaline etching processing, and acid etching processing on the middle frame, to remove surface oxide and another surface impurity on the middle frame member, so as to expose a fresh substrate surface.

503. Perform activation processing on the middle frame member in a fluoride solution, and then perform a dip galvanization operation, where a thickness is 5 micrometers.

504. Perform chemical nickel plating processing on the middle frame member, where a thickness is 5 micrometers.

505. Electroplate Cu on the middle frame member, where a thickness is 20 micrometers.

506. Perform chemical conversion passivation processing on the middle frame member on which Cu is electroplated.

507. Perform laser etching on a part that is in contact with a gold-plated metal spring plate and a part that is grounded, to remove a thickness of a passivated part, so as to expose a Cu-plated layer or a Ni-plated layer.

508. Perform a gold-plating operation on a laser-etched area.

According to the foregoing process, a copper-plated layer with high heat conductivity and a gold-plated layer with high electrical conductivity are formed on a mobile phone middle frame made of AZ91D die casting aluminum alloy. It can be learned after actual detection that, after heat dissipation, temperature of a chip area of the middle frame member that undergoes electroplating is at least 1 degree Celsius lower than temperature of AZ91D, no middle frame corrosion phenomenon occurs in a 24-hour neutral salt spray experiment, no corrosion phenomenon occurs in an area that is in contact with the gold-plated layer and that is of a gold-plated spring plate through which a radio frequency signal passes, and no signal problem caused by middle frame corrosion or galvanic corrosion generated due to contact between the middle frame and the spring plate occurs in the mobile phone.

Figure 6:
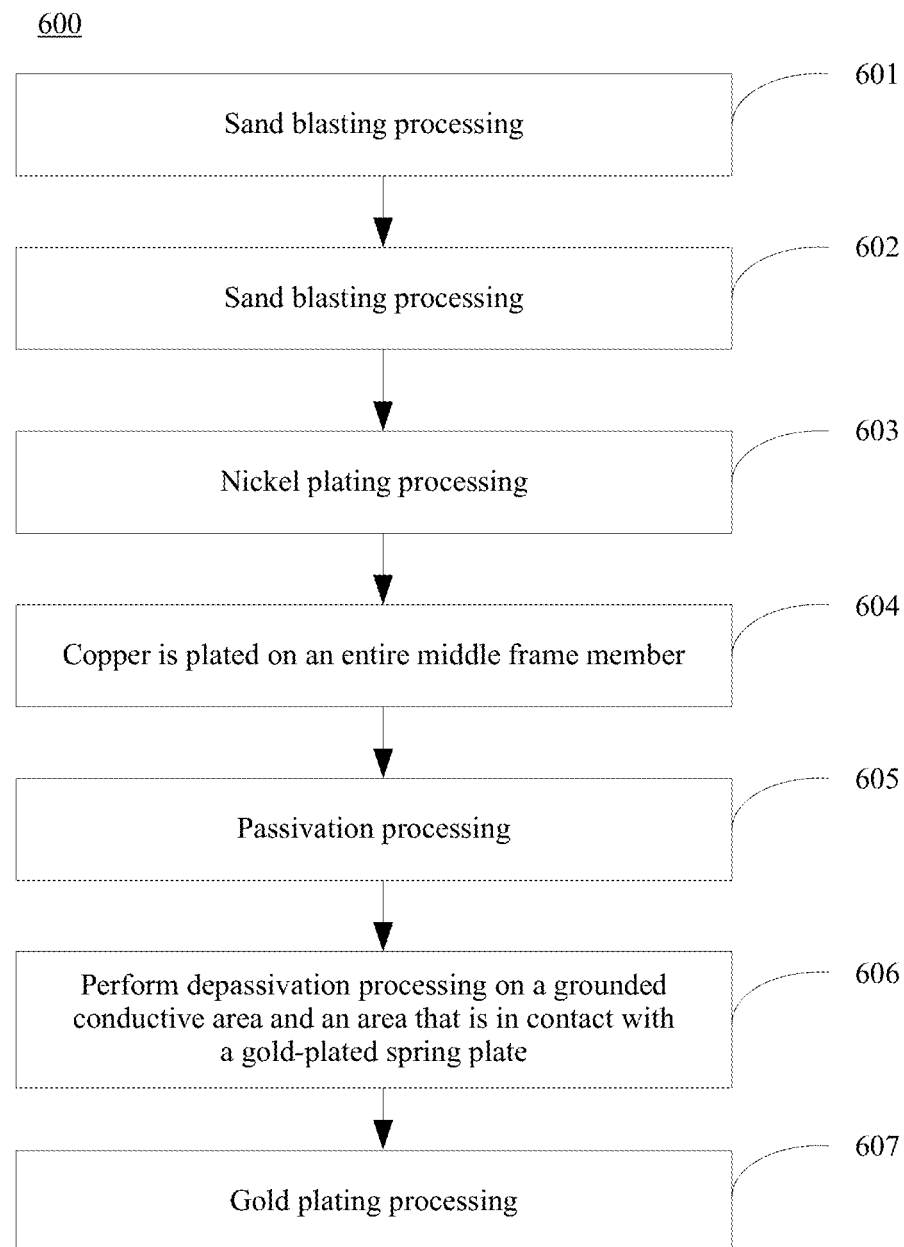
FIG. 6 is a schematic flowchart of a method for manufacturing a middle frame member according to another embodiment of the present disclosure.

FIG. 6 is a schematic block diagram of a method for manufacturing a middle frame member according to another embodiment of the present disclosure. A substrate of the middle frame member shown in FIG. 6 may be a mobile phone middle frame made of ZA3 die casting zinc alloy. In the method in FIG. 6, sand blasting processing and impurity removing processing are performed first, then copper is plated (a first metal layer is plated) on the entire middle frame member after nickel is plated (a metal transition layer is plated) on the entire middle frame member, then passivation is performed, and then depassivation is performed on some areas (a grounded conductive area and an area that is in contact with a gold-plated metal spring plate), and finally gold is plated (a second metal layer and a third metal layer are plated) in the grounded conductive area (a third area) and the area (a second area) that is in contact with the gold-plated metal spring plate.

Specifically, a method 600 shown in FIG. 6 includes the following blocks:

601. Perform slight sand blasting processing on ZA3 die casting zinc alloy, to remove dirt such as a decoating agent on a surface and improve density of the surface, so as to subsequently improve a binding force between a substrate and a coating layer.

602. Perform degreasing processing, alkaline etching processing, and acid etching processing on the middle frame, to remove surface oxide and another surface impurity on the middle frame member, so as to expose a fresh substrate surface.

603. Perform chemical nickel plating processing on the middle frame member, where a thickness is 3 micrometers.

604. Electroplate Cu on the middle frame member, where a thickness is 20 micrometers.

605. Perform chemical conversion passivation processing on the middle frame member on which Cu is electroplated.

606. Perform laser etching on a part that is in contact with a gold-plated metal spring plate and a part that is grounded, to remove a thickness of a passivated part, so as to expose a Cu-plated layer or a Ni-plated layer.

607. Perform a gold-electroplating operation on a laser-etched area.

According to the foregoing process, a copper-plated layer with high heat conductivity and a gold-plated layer with high electrical conductivity are formed on a mobile phone middle frame made of ZA3 die casting zinc alloy. It can be learned after actual detection that, after heat dissipation, temperature of a chip area of the middle frame member that undergoes electroplating is at least 1.5 degrees Celsius lower than temperature of the ZA3 die casting zinc alloy, no middle frame corrosion phenomenon occurs in a 24-hour neutral salt spray experiment, no corrosion phenomenon occurs in an area that is in contact with the gold-plated layer and that is of a gold-plated spring plate through which a radio frequency signal passes, and no signal problem caused by middle frame corrosion or galvanic corrosion generated due to contact between the middle frame and the spring plate occurs in the mobile phone.

Figure 7:
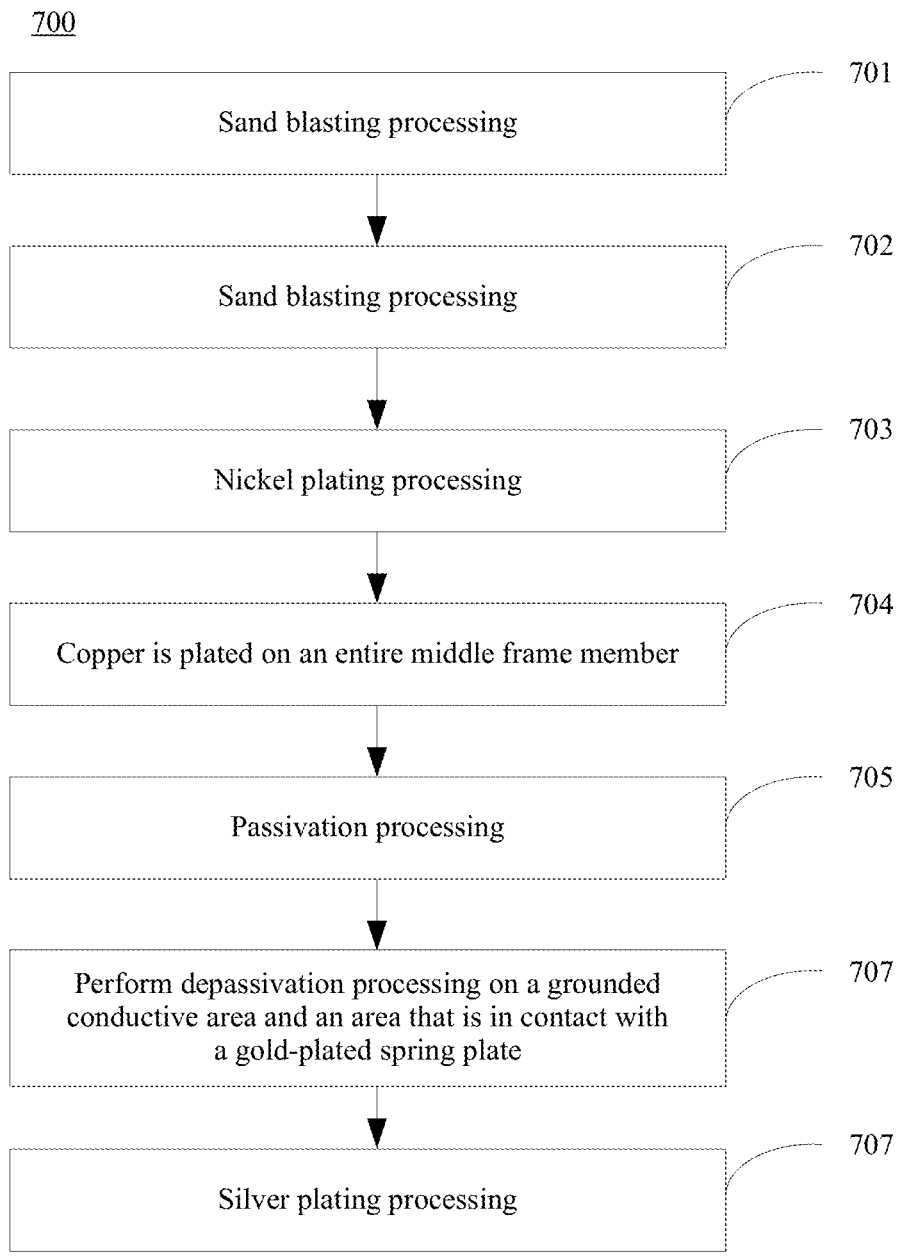
FIG. 7 is a schematic flowchart of a method for manufacturing a middle frame member according to another embodiment of the present disclosure.

FIG. 7 is a schematic block diagram of a method for manufacturing a middle frame member according to another embodiment of the present disclosure. A substrate of the middle frame member shown in FIG. 7 may be a mobile phone middle frame made of die casting aluminum and zinc alloy. In the method in FIG. 7, sand blasting processing and impurity removing processing are performed first, then copper is plated (a first metal layer is plated) on the entire middle frame member after nickel is plated (a metal transition layer is plated) on the entire middle frame member, then passivation processing is performed, and then depassivation is performed on some areas (a grounded conductive area and an area that is in contact with a gold-plated metal spring plate), and finally silver is plated (a second metal layer and a third metal layer are plated) in the grounded conductive area (a third area) and the area (a second area) that is in contact with the gold-plated metal spring plate.

Specifically, a method 700 shown in FIG. 7 includes the following blocks:

701. Perform slight sand blasting processing on a mobile phone middle frame made of die casting aluminum and zinc alloy, to remove dirt such as a decoating agent on a surface and improve density of the surface, so as to subsequently improve a binding force between a substrate and a coating layer.

702. Perform degreasing processing, alkaline etching processing, and acid etching processing on the middle frame, to remove surface oxide and another surface impurity on the middle frame member, so as to expose a fresh substrate surface.

703. Perform chemical nickel plating processing on the middle frame member, where a thickness is 2 micrometers.

704. Electroplate Cu on the middle frame member, where a thickness is 30 micrometers.

705. Perform chemical conversion passivation processing on the middle frame member on which Cu is electroplated.

706. Perform laser etching on a part that is in contact with a gold-plated metal spring plate and a part that is grounded, to remove a thickness of a passivated part, so as to expose a Cu-plated layer or a Ni-plated layer.

707. Perform a silver-plating operation on a laser-etched area.

According to the foregoing process, a copper-plated layer with high heat conductivity and a gold-plated layer with high electrical conductivity are formed on a mobile phone middle frame made of die casting aluminum and zinc alloy. It can be learned after actual detection that, after heat dissipation, temperature of a chip area of the middle frame member that undergoes electroplating is at least 1.5 degrees Celsius lower than temperature of the aluminum and zinc alloy, no middle frame corrosion phenomenon occurs in a 24-hour neutral salt spray experiment, no corrosion phenomenon occurs in an area that is in contact with the gold-plated layer and that is of a gold-plated spring plate through which a radio frequency signal passes, and no signal problem caused by middle frame corrosion or galvanic corrosion generated due to contact between the middle frame and the spring plate occurs in the mobile phone.

Figure 8:
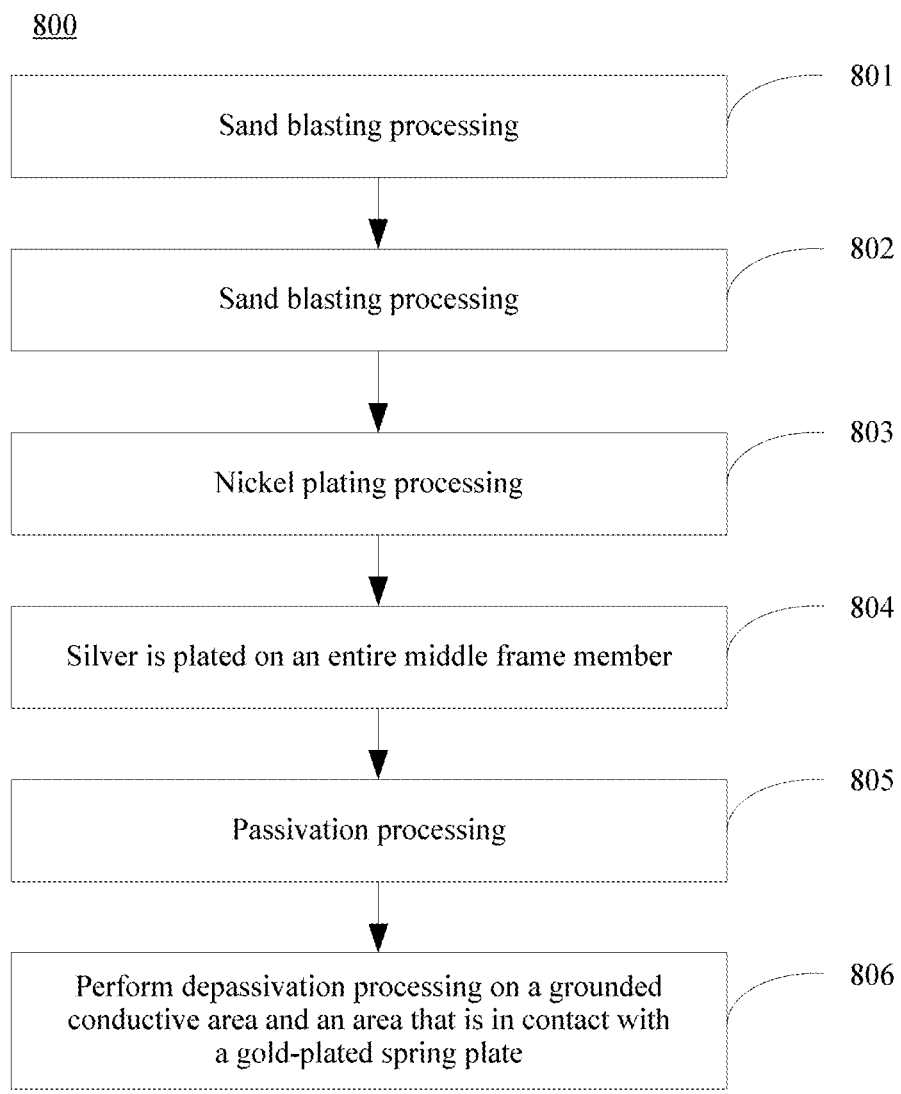
FIG. 8 is a schematic flowchart of a method for manufacturing a middle frame member according to another embodiment of the present disclosure.

FIG. 8 is a schematic block diagram of a method for manufacturing a middle frame member according to another embodiment of the present disclosure. A substrate of the middle frame member shown in FIG. 8 may be a mobile phone middle frame made of ADC12 die casting aluminum alloy. In the method in FIG. 8, sand blasting processing and impurity removing processing are performed first, then silver is plated (a first metal layer is plated) on the entire middle frame member after nickel is plated (a metal transition layer is plated) on the entire middle frame member, then passivation processing is performed, and then depassivation is performed on some areas (a grounded conductive area and an area that is in contact with a gold-plated metal spring plate).

Specifically, a method 800 shown in FIG. 8 includes the following blocks:

801. Perform slight sand blasting processing on ADC12 aluminum alloy, to remove dirt such as a decoating agent on a surface and improve density of the surface, so as to subsequently improve a binding force between a substrate and a coating layer.

802. Perform degreasing processing, alkaline etching processing, and acid etching processing on the middle frame, to remove surface oxide and another surface impurity on the middle frame member, so as to expose a fresh substrate surface.

803. Perform chemical nickel plating processing on the middle frame member, where a thickness is 3 micrometers.

804. Electroplate Ag on the middle frame member, where a thickness is 10 micrometers.

805. Perform chemical conversion passivation processing on the middle frame member on which Ag is electroplated.

806. Perform laser etching on a part that is in contact with a gold-plated metal spring plate, to remove a thickness of a passivated part, so as to expose a silver-plated layer; and perform laser etching on a part that is grounded for electrical conductivity, to expose a silver-plated layer or the substrate.

According to the foregoing process, a silver-plated layer with high heat conductivity and high heat conductivity is formed on a mobile phone middle frame made of ADC12 die casting aluminum alloy. It can be learned after actual detection that, after heat dissipation, temperature of a chip area of the middle frame member that undergoes electroplating is at least 1.2 degrees Celsius lower than temperature of ADC12, no middle frame corrosion phenomenon occurs in a 24-hour neutral salt spray experiment, no corrosion phenomenon occurs in an area that is in contact with the silver-plated layer and that is of a gold-plated spring plate through which a radio frequency signal passes, and no signal problem caused by middle frame corrosion or galvanic corrosion generated due to contact between the middle frame and the spring plate occurs in the mobile phone.

Figure 9:
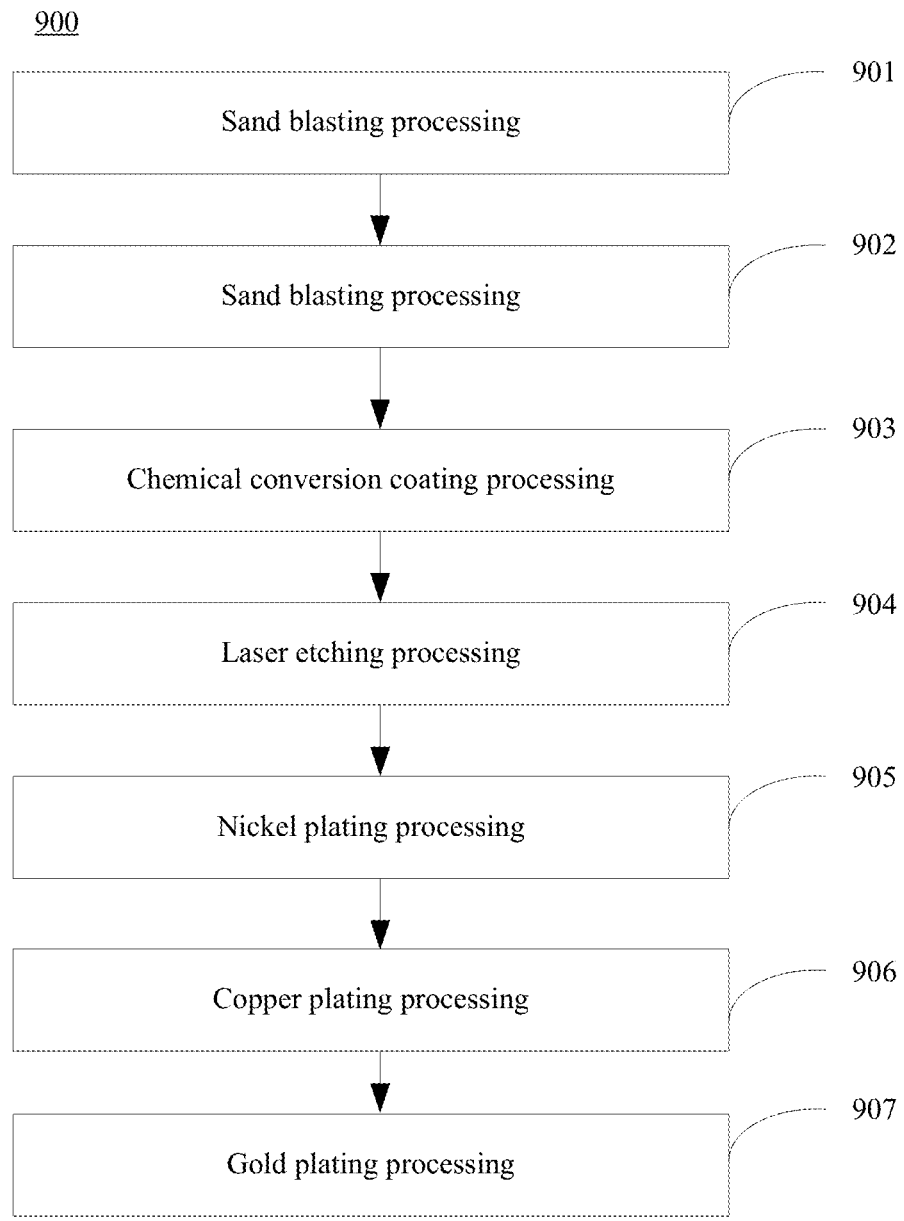
FIG. 9 is a schematic flowchart of a method for manufacturing a middle frame member according to another embodiment of the present disclosure.

FIG. 9 is a schematic block diagram of a method for manufacturing a middle frame member according to another embodiment of the present disclosure. A substrate of the middle frame member shown in FIG. 9 may be a mobile phone middle frame made of die casting aluminum and magnesium alloy. In the method in FIG. 9, sand blasting processing and impurity removing processing are performed first, then chemical conversion coating processing is performed on the entire middle frame member, then laser etching is performed on some areas (corresponding to an area that emits a relatively large amount of heat, a grounded conductive area, and an area that is in contact with a gold-plated metal spring plate), then copper is plated (a first metal layer is plated) after nickel is plated (a metal transition layer is plated) in the areas, and finally gold is plated (a second metal layer and a third metal layer are plated) in the areas.

Specifically, a method 900 shown in FIG. 9 includes the following blocks:

901. Perform slight sand blasting processing on a middle frame member made of aluminum and magnesium alloy, to remove dirt such as a decoating agent on a surface and improve density of the surface, so as to subsequently improve a binding force between a substrate and a coating layer.

902. Perform degreasing processing, alkaline etching processing, and acid etching processing on the middle frame, to remove surface oxide and another surface impurity on the middle frame member, so as to expose a fresh substrate surface.

903. Perform chemical conversion coating processing on the middle frame member.

904. Perform laser etching on a part that is in contact with a metal spring plate, a heat dissipation area of a chip, and a heat dissipation area of a camera, to expose the substrate.

905. Perform chemical nickel plating processing on an etched area of the middle frame member, where a thickness is 3 micrometers.

906. Electroplate Cu in the etched area of the middle frame member, where a thickness is 20 micrometers.

907. Perform gold plating processing in the same area of the middle frame member on which Cu is electroplated in the etched area, where a thickness of a gold layer is 5 micrometers.

According to the foregoing process, a copper-plated layer with high heat conductivity and a gold-plated layer with high electrical conductivity are formed in some areas of a mobile phone middle frame made of die casting aluminum and magnesium alloy. It can be learned from actual detection that, after heat dissipation, temperature of a chip area of the middle frame member that undergoes electroplating is at least 1 degree Celsius lower than temperature of the mobile phone middle frame made of die casting aluminum and magnesium alloy, no middle frame phenomenon corrosion occurs in an 8-hour neutral salt spray experiment, no corrosion phenomenon occurs in an area that is in contact with the gold-plated layer and that is of a gold-plated spring plate through which a radio frequency signal passes, and no signal problem caused by middle frame corrosion or galvanic corrosion generated due to contact between the middle frame and the spring plate occurs in the mobile phone.

Figure 10:
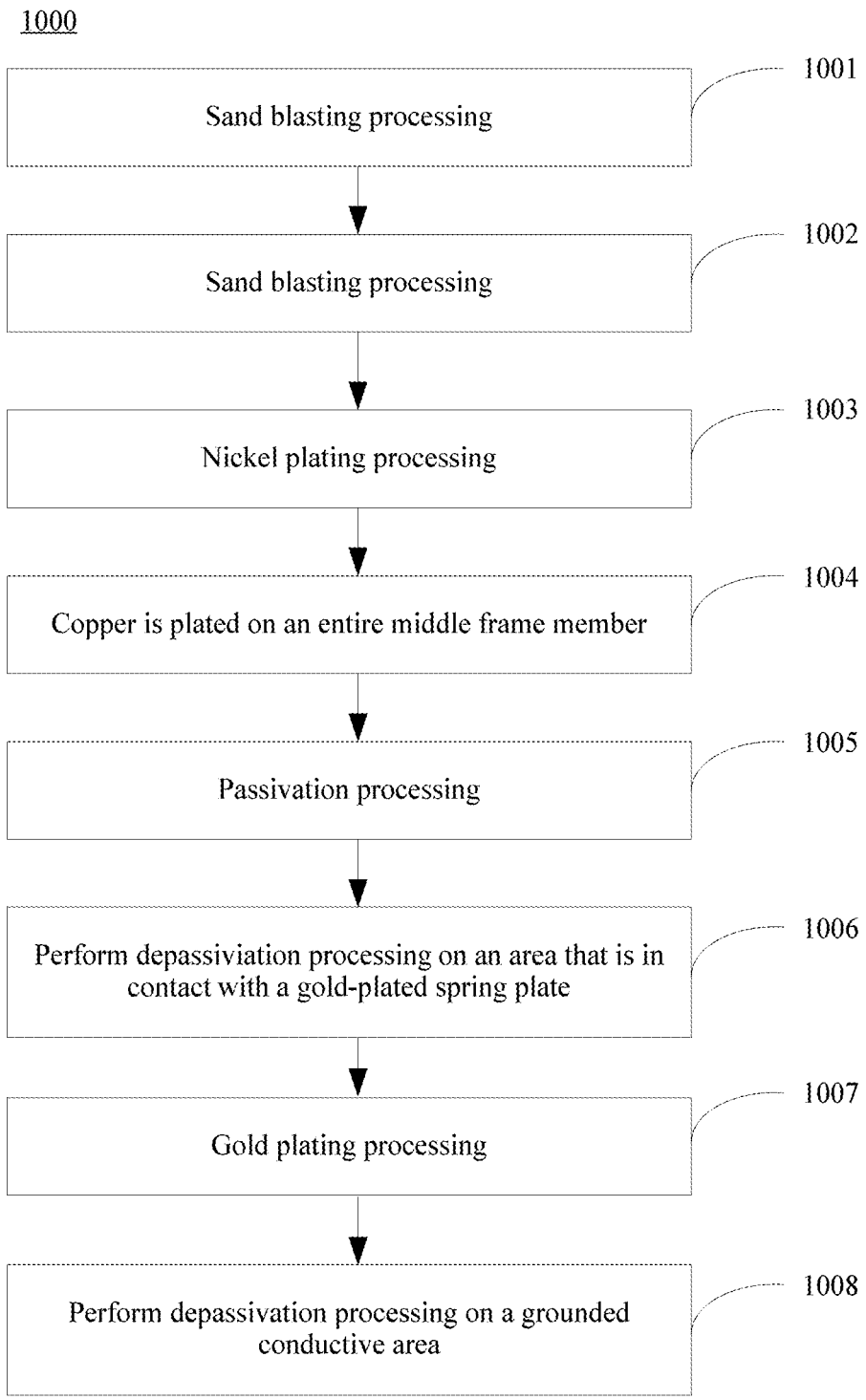
FIG. 10 is a schematic flowchart of a method for manufacturing a middle frame member according to another embodiment of the present disclosure.

FIG. 10 is a schematic block diagram of a method for manufacturing a middle frame member according to another embodiment of the present disclosure. A substrate of the middle frame member shown in FIG. 10 may be a mobile phone middle frame made of stamped stainless steel. In the method in FIG. 10, sand blasting processing and impurity removing processing are performed first, then copper is plated (a first metal layer is plated) on the entire middle frame member after nickel is plated (a metal transition layer is plated) on the entire middle frame member, then passivation is performed, and then depassivation is performed on some areas (a grounded conductive area and an area that is in contact with a gold-plated metal spring plate), and finally gold is plated (a second metal layer is plated) in the area (a second area) that is in contact with the gold-plated metal spring plate.

Specifically, a method 1000 shown in FIG. 10 includes the following blocks:

1001. Remove dirt such as a decoating agent on a surface of stainless steel and improve density of the surface, so as to subsequently improve a binding force between a substrate and a coating layer.

1002. Perform degreasing processing, alkaline etching processing, and acid etching processing on the middle frame, to remove surface oxide and another surface impurity on the middle frame member, so as to expose a fresh substrate surface.

1003. Perform chemical nickel plating processing on the middle frame member, where a thickness is 3 micrometers.

1004. Electroplate Cu on the middle frame member, where a thickness is 15 micrometers.

1005. Perform chemical conversion passivation processing on the middle frame member on which Cu is electroplated.

1006. Perform laser etching on a part that is in contact with a gold-plated metal spring plate, to remove a thickness of a passivated part, so as to expose a Cu-plated layer or a Ni-plated layer.

1007. Perform a gold-plating operation on a laser-etched area.

1008. Perform laser etching on a grounded conductive area, to remove a passivation thickness or directly expose the substrate.

According to the foregoing process, a copper-plated layer with high heat conductivity and a gold-plated layer with high electrical conductivity are formed on a mobile phone middle frame made of stainless steel. It can be learned from actual detection that, after heat dissipation, temperature of a chip area of the middle frame member that undergoes electroplating is at least 1.8 degrees Celsius lower than temperature of the stainless steel, no middle frame corrosion phenomenon occurs in a 24-hour neutral salt spray experiment, no corrosion phenomenon occurs in an area that is in contact with the gold-plated layer and that is of a gold-plated spring plate through which a radio frequency signal passes, and no signal problem caused by middle frame corrosion or galvanic corrosion generated due to contact between the middle frame and the spring plate occurs in the mobile phone.

It should be noted that examples in FIG. 1 to FIG. 10 are merely intended to help persons skilled in the art understand the embodiments of the present disclosure instead of limiting the embodiments of the present disclosure to a specific value or a specific scenario shown in the examples. Apparently, persons skilled in the art can make various equivalent modifications or variations according to the examples in FIG. 1 to FIG. 10, for example, properly change a metal layer thickness or a metal material, or properly reduce some unnecessary actions. Such modifications or variations also fall within the scope of the embodiments of the present disclosure.

For example, dirt removing and impurity removing processing may not need to be performed in the embodiments of the present disclosure, or no transition layer (no nickel) is plated in the embodiments of the present disclosure. In the embodiments of the present disclosure, gold or silver may be plated only in an area that is in contact with a gold-plated spring plate, or gold or silver may be plated in an area that is in contact with a gold-plated spring plate, and gold or silver may also be plated in a grounded conductive area. In addition, in the embodiments of the present disclosure, copper may be only electroplated in some areas, for example, copper may be plated in an area other than a grounded conductive area and an area that is in contact with a gold-plated spring plate. In this way, no laser etching is performed in subsequent processing, but gold or silver is directly plated in the grounded conductive area and the area that is in contact with the gold-plated spring plate. Alternatively, copper or silver may be electroplated on the entire the middle frame member, then laser etching is performed on an area other than a grounded conductive area and an area that is in contact with a gold-plated spring plate, to remove a passivated layer, and then subsequent processing is performed. All the foregoing variations shall fall within the scope of the embodiments of the present disclosure.

The foregoing describes in detail the method for manufacturing a middle frame member according to the embodiments of the present disclosure with reference to FIG. 1 to FIG. 10. The following describes in detail a middle frame member in the embodiments of the present disclosure with reference to FIG. 11 to FIG. 13.

Figure 11:
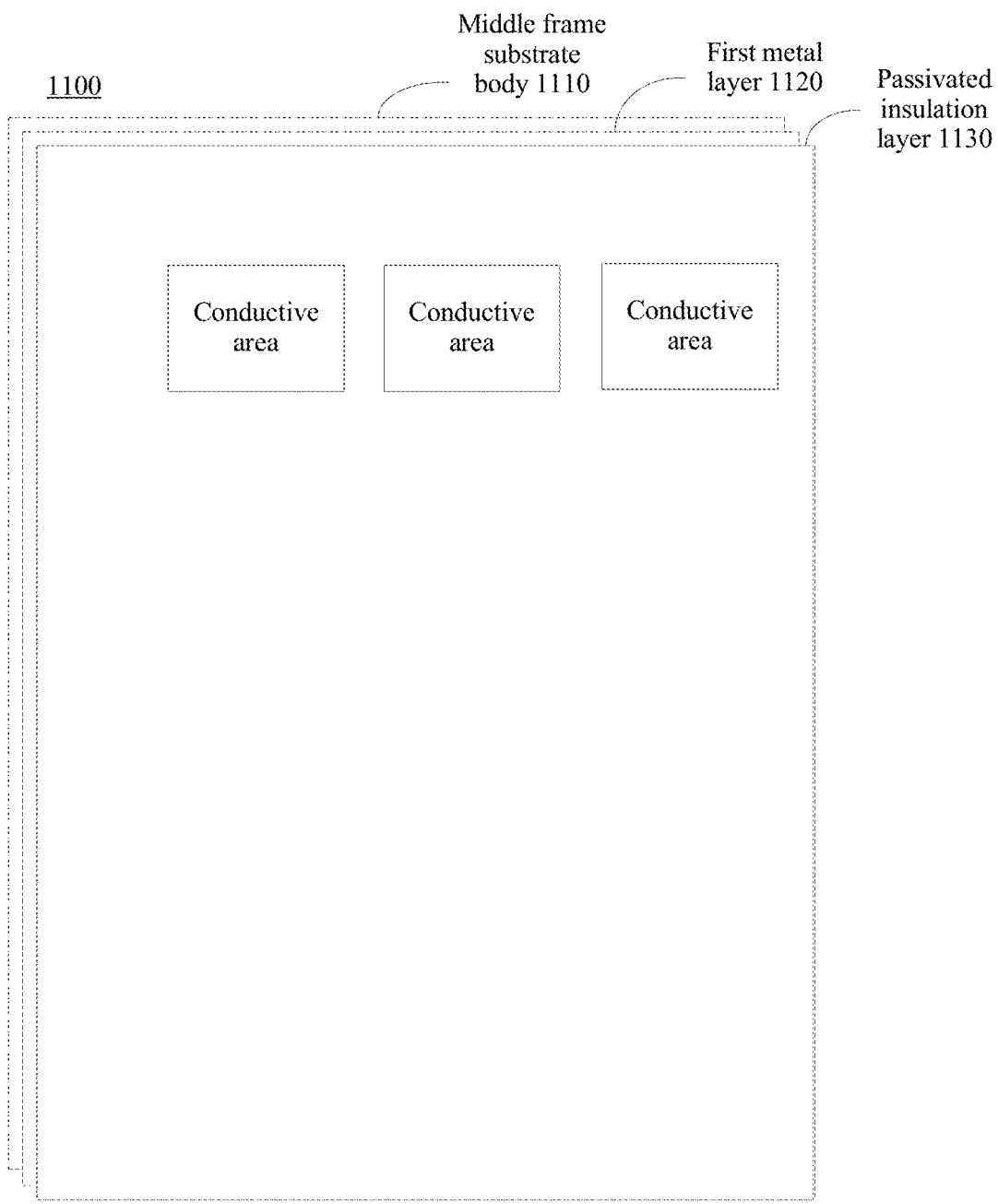
FIG. 11 is a schematic block diagram of a middle frame member according to an embodiment of the present disclosure.

FIG. 11 is a schematic block diagram of a middle frame member according to an embodiment of the present disclosure. A middle frame member 1100 shown in FIG. 11 is a support part inside an electronic product for supporting components in the electronic product. It should be noted that the middle frame member 1100 shown in FIG. 11 is corresponding to the method in FIG. 1, and may be obtained by means of manufacturing according to the method in FIG. 1. For components and functions of the middle frame member 1100 in FIG. 11, refer to the description in the foregoing method. To avoid repetition, details are not described herein.

It should be understood that FIG. 11 is merely an example, and a size and a shape of the middle frame member in FIG. 11 are merely examples. A specific shape of the middle frame member is determined according to actual use. This is not limited in this embodiment of the present disclosure. In addition, a first area shown in FIG. 11 is an area, other than a conductive area, on an outer surface of a middle frame substrate body. However, this embodiment of the present disclosure is not limited thereto. For example, the first area may be all or a part of the outer surface of the middle frame substrate body, for example, the first area may be an area that emits a relatively large amount of heat, or the first area may include a conductive area. For brevity, no more figures are presented in this embodiment of the present disclosure.

In other words, according to context of this embodiment of the present disclosure, corresponding variations may be made to a structure and the shape of the middle frame member. For example, the middle frame member may further include a second metal layer, or may further include a third metal layer, and may further include a metal transition layer. Such modifications also fall within the scope of the embodiments of the present disclosure. For brevity, no more figures are presented in this embodiment of the present disclosure.

Specifically, the middle frame member 1100 shown in FIG. 11 includes a middle frame substrate body 1110, a first metal layer 1120, and a passivated insulation layer 1130.

The first metal layer 1120 is attached to a first area of the middle frame substrate body 1110. A coefficient of heat conductivity of the first metal layer is greater than a coefficient of heat conductivity of the middle frame substrate body, the first area includes all or a part of an outer surface of the middle frame substrate body, and the first metal layer is used to conduct, to the middle frame substrate body, heat generated by at least one of the components that is in contact with or adjacent to the first metal layer.

The passivated insulation layer 1130 is attached to a surface of the first metal layer, and can resist corrosion and is insulated.

Therefore, in this embodiment of the present disclosure, first metal with a high coefficient of heat conductivity is attached to a first area of a middle frame substrate body, and a heat-conducting capability of the middle frame member is improved by using the first metal layer, so that heat of some components that emit a large amount of heat can be effectively conducted to the middle frame substrate body in time, and excessively high partial temperature is avoided. In addition, the middle frame substrate body can conduct, as soon as possible, the heat generated by the components in an electronic device, so that heat dissipation performance of the middle frame member is improved.

It should be understood that, that the first metal layer conducts heat to the middle frame substrate body may be understood as: The first metal layer conducts partial high-temperature heat to the entire first metal layer and the middle frame substrate body. Heat is horizontally conducted to the entire first metal layer and is vertically conducted to the middle frame substrate body. Horizontal conduction and vertical conduction of heat are simultaneously performed, that is, the first metal layer is used to horizontally and vertically conduct heat. In other words, the first metal layer is used to conduct, to the entire first metal layer and the middle frame substrate body, the heat generated by at least one of the components that is in contact with or adjacent to the first metal layer.

Optionally, in another embodiment, the components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

Optionally, in another embodiment, the passivated insulation layer is obtained after chemical conversion coating processing is performed on the surface of the first metal or a polymer organic coating is sprayed on the surface of the first metal layer.

It should be understood that the passivated insulation layer may be obtained in another manner in this embodiment of the present disclosure. This embodiment of the present disclosure is not limited thereto.

Optionally, in another embodiment, the first metal layer includes any one of or a combination of the following items: a copper layer, a silver layer, or a gold layer. A thickness of the first metal layer may be 0.01 to 50 micrometers.

Therefore, in this embodiment of the present disclosure, an overall heat-conducting capability of a die casting alloy body is improved by plating a layer of copper (Cu), silver (Ag), or gold (Au) with a high coefficient of heat conductivity on the surface. A coefficient of heat conductivity of copper Cu is 401 W/m·k, a coefficient of heat conductivity of silver Ag is 429 W/m·k, and a coefficient of heat conductivity of gold Au is 317 W/m·k. All the coefficients of heat conductivity are higher than a coefficient of heat conductivity of a middle frame substrate in an existing electronic product, and a better heat dissipation effect is provided.

Optionally, in another embodiment, the first area includes all or a part of the outer surface of the middle frame substrate body except an area in which electricity is conducted. The first metal layer is attached to the area that is on the outer surface of the middle frame substrate body and in which electricity is conducted.

In other words, the first metal layer is specifically attached to the first area and the area in which electricity is conducted. The passivated insulation layer is attached only to the surface of the first metal layer corresponding to the first area.

Optionally, in another embodiment, the area in which electricity is conducted includes a second area and/or a third area. The second area is used to connect to a metal antenna spring plate in the electronic product, and the third area is used to connect to a grounded conductive component in the electronic product, to ground the middle frame member.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

After depassivation processing, the insulation layer is removed, and the middle frame substrate body or the first metal layer is exposed, so that the middle frame substrate body or the first metal layer can be electrically conductive to another component in the electronic product.

It should be understood that, in this embodiment of the present disclosure, depassivation processing may be performed by means of laser etching, or depassivation processing may be performed in another manner, such as a mechanical method. This is not limited in this embodiment of the present disclosure.

Optionally, in another embodiment, the middle frame member further includes:

a second metal layer, attached to the second area on the surface of the middle frame substrate body, where an electrode potential difference between the second metal layer and the metal antenna spring plate is less than an electrode potential difference between the middle frame substrate body and the metal antenna spring plate.

It should be understood that, because different pieces of metal have different electrode potentials, there is galvanic corrosion between two different pieces of metal in contact with each other. A larger electrode potential difference between the two pieces of metal indicates severer galvanic corrosion. Second metal selected in this embodiment of the present disclosure meets a condition that the electrode potential difference between the second metal and the metal antenna spring plate is less than the electrode potential difference between the middle frame substrate body and the metal antenna spring plate. Therefore, galvanic corrosion between the second metal layer and the metal antenna spring plate is less than galvanic corrosion between the middle frame substrate body and the metal antenna spring plate, and when a material of the second metal layer is the same as a material of the metal antenna spring plate, that is, when the electrode potential difference between the second metal layer and the metal antenna spring plate is zero, galvanic corrosion can be avoided.

Therefore, in this embodiment of the present disclosure, the second metal layer whose electrode potential is the same as or is approximately the same as that of the metal antenna spring plate is attached to an area that is in contact with the gold-plated spring plate, so that galvanic corrosion can be prevented or reduced, and the middle frame member can be in fine contact with the gold-plated spring plate. Therefore, signal discontinuity is avoided, and user experience is improved.

Further, in another embodiment, when a material of the metal antenna spring plate is gold, the second metal layer is a silver layer or a gold layer. For example, a thickness of the second metal layer is 0.01 to 50 micrometers.

It should be noted that, in a technology for enabling a frequently-used material such as die casting aluminum alloy, die casting magnesium alloy, or die casting zinc alloy of an existing middle frame to be in contact with a gold-plated antenna spring plate, signal continuity of an electronic product such as a mobile phone is ensured. Currently, there is an electrode potential difference between a die casting middle frame member such as aluminum alloy, magnesium alloy, or zinc alloy and a gold element of the gold-plated spring plate. Consequently, galvanic corrosion is caused, the gold-plated spring plate cannot be in fine contact with the middle frame of the electronic product such as a mobile phone as a result of corrosion, signal discontinuity is caused, and use of a consumer is affected.

In this embodiment of the present disclosure, galvanic corrosion can be prevented or reduced by disposing a gold layer or a silver layer in an area that is in contact with the gold-plated spring plate, so that the middle frame member can be in fine contact with the gold-plated spring plate. Therefore, signal discontinuity is avoided, and user experience is improved.

It should be understood that, in this embodiment of the present disclosure, the second area may be obtained in the following manners. For example, the second metal layer may be disposed in at least the following two cases. In a first case, when the first area includes the second area, depassivation processing is performed first, and then the second metal layer is plated. In a second case, the first area does not include the second area. Because the first metal layer is not plated in the second area, in this case, the second metal layer is directly electroplated in the second area.

Optionally, in another embodiment, the middle frame member may further include:

a third metal layer, attached to the third area on the surface of the middle frame substrate body, where a neutral salt spray corrosion resistance capability of the third metal layer is higher than that of the middle frame substrate body.

Further, in another embodiment, the third metal layer is a gold layer or a silver layer.

A thickness of the third metal layer is 0.01 to 50 micrometers.

It should be noted that an existing middle frame material, especially die casting aluminum alloy or die casting magnesium alloy, has insufficient corrosion resistance performance. Particularly, when a surface of an original substrate in some areas of a mobile phone middle frame is exposed by means of laser etching for grounded electric conduction, there is a risk of not resisting neutral salt spray corrosion.

In this embodiment of the present disclosure, the third metal layer is plated in the grounded conductive area, so that the neutral salt spray corrosion resistance capability is enhanced, and user experience is improved.

It should be understood that the third metal layer may be another metal layer provided that neutral salt spray corrosion resistance performance of the third metal layer is higher than that of a middle frame basis. This embodiment of the present disclosure is not limited thereto.

It should be noted that the second metal layer and the third metal layer in this embodiment of the present disclosure may be metal layers of a same type, and the second metal layer and the third metal layer may be simultaneously electroplated in this embodiment of the present disclosure.

When the first area includes the second area and the third area, in this embodiment of the present disclosure, depassivation processing may be first performed at positions in the first area that are corresponding to the second area and the third area, to expose the substrate body or the first metal layer, and then the second metal layer and the third metal layer are electroplated. The second area and the third area may be different areas, and the second area and the third area do not coincide with each other.

Optionally, in another embodiment, the middle frame substrate includes any one of or a combination of the following items: die casting aluminum alloy, die casting magnesium alloy, die casting zinc alloy, or stainless steel.

For example, the middle frame substrate may be ADC12 die casting aluminum alloy, AZ91D die casting magnesium alloy, ZA3 die casting zinc alloy, die casting aluminum and zinc alloy, die casting aluminum and magnesium alloy, stamped stainless steel, or the like. This embodiment of the present disclosure is not limited thereto.

Optionally, in another embodiment, when the middle frame substrate is die casting magnesium alloy, the middle frame member further includes:

a zinc layer, located between the first metal layer and the middle frame substrate body, where the zinc layer is obtained after activation processing and dip galvanization processing are performed on the middle frame substrate body.

Specifically, because the die casting magnesium alloy is extremely active, to simulate corrosion of the middle frame substrate, in this embodiment of the present disclosure, activation processing is first performed on the middle frame member in a fluoride solution, and then a dip galvanization operation is performed. A thickness of the zinc layer may be 3 micrometers, 5 micrometers, 10 micrometers, or the like. This is not limited in this embodiment of the present disclosure. The first metal layer is electroplated after dip galvanization in this embodiment of the present disclosure.

Optionally, in another embodiment, the middle frame member further includes:

a metal transition layer, located between the first metal layer and the middle frame substrate body, where both a capability of the metal transition layer to be bound with the middle frame substrate body and a capability of the metal transition layer to be bound with the first metal layer are higher than a capability of the middle frame substrate body to be bound with the first metal layer.

Further, in another embodiment, a thickness of the metal transition layer is 0.01 to 20 micrometers.

It should be understood that a material of the metal transition layer is not limited in this embodiment of the present disclosure provided that both the capability of the metal transition layer to be bound with the middle frame substrate body and the capability of the metal transition layer to be bound with the first metal layer are higher than the capability of the middle frame substrate body to be bound with the first metal layer. For example, the material of the metal transition layer may be nickel. This embodiment of the present disclosure is not limited thereto.

Optionally, in another embodiment, the middle frame substrate body is a middle frame substrate body that undergoes sand blasting processing and/or impurity removing processing.

Specifically, during generation of the middle frame member, before the middle frame member body is obtained, in this embodiment of the present disclosure, sand blasting processing and/or impurity removing processing may be performed first, then the metal transition layer is plated, and finally processing such as electroplating the first metal layer is performed.

For example, during generation of the middle frame member, in this embodiment of the present disclosure, slight sand blasting processing may be performed on the middle frame substrate body, to remove dirt such as a decoating agent on the surface and improve density of the surface, so as to subsequently improve a binding force between the substrate and a coating layer.

Then, degreasing processing, alkaline etching processing, and acid etching processing are performed on the middle frame, to remove surface oxide and another surface impurity on the middle frame member, so that a fresh substrate surface is exposed, and subsequent metal layer plating is facilitated.

Figure 12:
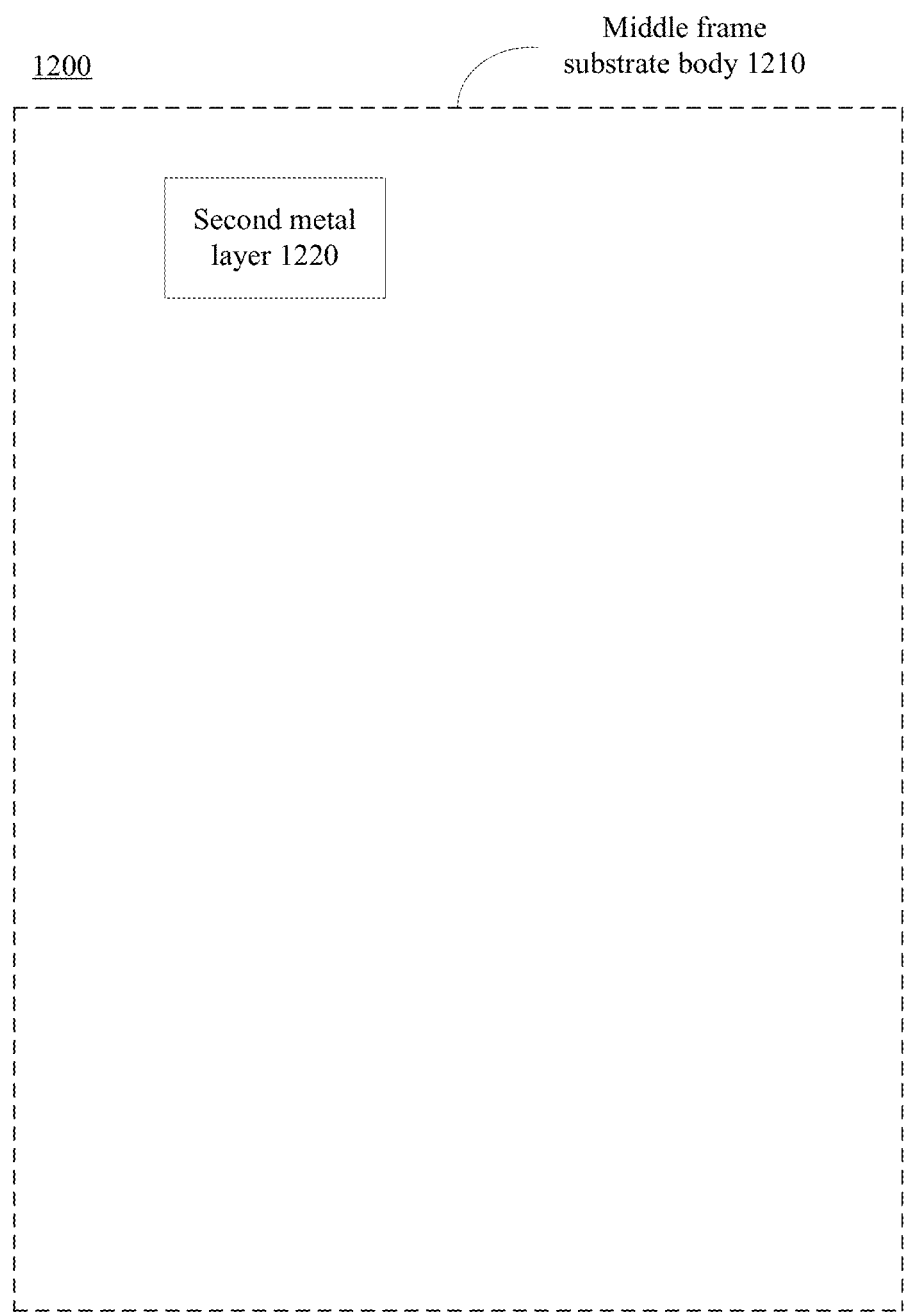
FIG. 12 is a schematic block diagram of a middle frame member according to another embodiment of the present disclosure.

FIG. 12 is a schematic block diagram of a middle frame member according to another embodiment of the present disclosure. A middle frame member 1200 shown in FIG. 12 is a support part used in an electronic product. It should be noted that the middle frame member 1200 shown in FIG. 12 is corresponding to the method in FIG. 2, and may be obtained by means of manufacturing according to the method in FIG. 2. For components and functions of the middle frame member 1200 in FIG. 12, refer to the description in the foregoing method. To avoid repetition, details are not described herein.

It should be understood that FIG. 12 is merely an example, and a size and a shape of the middle frame member in FIG. 12 are merely examples. A specific shape of the middle frame member is determined according to actual use. This is not limited in this embodiment of the present disclosure. In addition, according to context of this embodiment of the present disclosure, corresponding variations may be made to a structure and the shape of the middle frame member. For example, the middle frame member may further include a first metal layer, a third metal layer, and the like, and may further include a metal transition layer. Such modifications also fall within the scope of the embodiments of the present disclosure. To avoid repetition, no more figures are presented in this embodiment of the present disclosure.

Specifically, the middle frame member 1200 shown in FIG. 12 includes a substrate body 1210 and a second metal layer 1220.

The second metal 1220 is attached to a second area on a surface of the middle frame substrate body 1210. The second area is used to connect to a metal antenna spring plate in the electronic product, and an electrode potential difference between the second metal and the metal antenna spring plate is less than an electrode potential difference between the middle frame substrate body and the metal antenna spring plate.

It should be understood that, because different pieces of metal have different electrode potentials, there is galvanic corrosion between two different pieces of metal in contact with each other. A larger electrode potential difference between the two pieces of metal indicates severer galvanic corrosion. Second metal selected in this embodiment of the present disclosure meets a condition that the electrode potential difference between the second metal and the metal antenna spring plate is less than the electrode potential difference between the middle frame substrate body and the metal antenna spring plate. Therefore, galvanic corrosion between the second metal layer and the metal antenna spring plate is less than galvanic corrosion between the middle frame substrate body and the metal antenna spring plate, and when a material of the second metal layer is the same as a material of the metal antenna spring plate, that is, when the electrode potential difference between the second metal layer and the metal antenna spring plate is zero, galvanic corrosion can be avoided.

Therefore, in this embodiment of the present disclosure, a second metal layer whose electrode potential is the same as or is approximately the same as that of a metal antenna spring plate is attached to an area that is in contact with the gold-plated spring plate, so that galvanic corrosion can be prevented or reduced, and a middle frame member can be in fine contact with the gold-plated spring plate. Therefore, signal discontinuity is avoided, and user experience is improved.

Optionally, in another embodiment, components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

Optionally, in another embodiment, when a material of the metal antenna spring plate is gold, the second metal layer is a silver layer or a gold layer. For example, a thickness of the second metal layer is 0.01 to 50 micrometers.

Therefore, in this embodiment of the present disclosure, galvanic corrosion can be prevented or reduced by disposing a gold layer, a silver layer, or the like in an area that is in contact with the gold-plated spring plate, so that the middle frame member can be in fine contact with the gold-plated spring plate. Therefore, signal discontinuity is avoided, and user experience is improved.

Optionally, in another embodiment, the middle frame member may further include:

a third metal layer, attached to a third area on the surface of the middle frame substrate body, where the third area is connected to a grounded conductive component in the electronic product, to ground the middle frame member, and a neutral salt spray corrosion resistance capability of the third metal layer is higher than that of the middle frame substrate body.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

Optionally, in another embodiment, the third metal layer is a gold layer or a silver layer.

For example, a thickness of the third metal layer is 0.01 to 50 micrometers.

Therefore, in this embodiment of the present disclosure, the third metal layer is disposed in the grounded conductive area, so that the neutral salt spray corrosion resistance capability is enhanced, and user experience is improved.

It should be understood that the third metal layer may be another metal layer provided that neutral salt spray corrosion resistance performance of the third metal layer is higher than that of a middle frame basis. This embodiment of the present disclosure is not limited thereto.

It should be noted that the second metal layer and the third metal layer in this embodiment of the present disclosure may be metal layers of a same type, and the second metal layer and the third metal layer may be simultaneously electroplated in this embodiment of the present disclosure.

Figure 13:
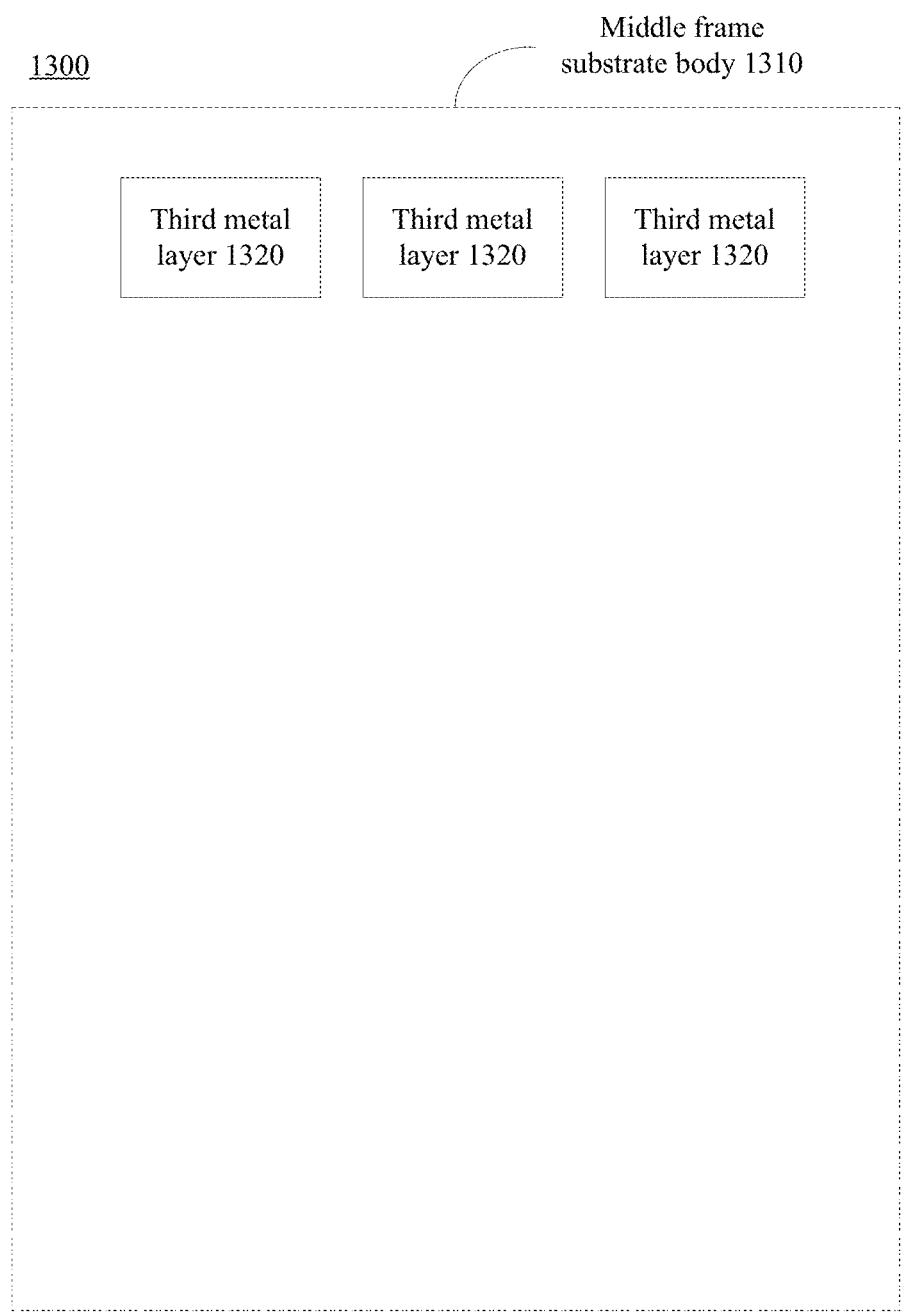
FIG. 13 is a schematic block diagram of a middle frame member according to another embodiment of the present disclosure.

FIG. 13 is a schematic block diagram of a middle frame member according to another embodiment of the present disclosure. A middle frame member 1300 shown in FIG. 13 is a support part used in an electronic product. It should be noted that the middle frame member 1300 shown in FIG. 13 is corresponding to the method in FIG. 3, and may be obtained by means of manufacturing according to the method in FIG. 3. For components and functions of the middle frame member 1300 in FIG. 13, refer to the description in the foregoing method. To avoid repetition, details are not described herein.

It should be understood that FIG. 13 is merely an example, and a size and a shape of the middle frame member in FIG. 13 are merely examples. A specific shape of the middle frame member is determined according to actual use. This is not limited in this embodiment of the present disclosure. In addition, according to context of this embodiment of the present disclosure, corresponding variations may be made to a structure and the shape of the middle frame member. For example, the middle frame member may further include a first metal layer, a third metal layer, a metal transition layer, and the like. Such modifications also fall within the scope of the embodiments of the present disclosure. To avoid repetition, no more figures are presented in this embodiment of the present disclosure.

Specifically, the middle frame member 1300 shown in FIG. 13 includes a substrate body 1310 and a third metal layer 1320.

The third metal layer 1320 is attached to a third area on a surface of the middle frame substrate body. The third area is used to connect to a grounded conductive component in the electronic product, to ground the middle frame member, and a neutral salt spray corrosion resistance capability of the third metal layer is higher than that of the middle frame substrate body.

Optionally, in another embodiment, components in the electronic product include at least one of a printed circuit board PCB, a chip, a battery, or a screen.

It should be understood that the components in this embodiment of the present disclosure may further include another component in the electronic product, for example, may further include components such as an antenna and a camera. This embodiment of the present disclosure is not limited thereto.

Optionally, in another embodiment, the third metal layer is a gold layer or a silver layer. A thickness of the third metal layer is 0.01 to 50 micrometers.

Therefore, in this embodiment of the present disclosure, a third metal layer is disposed in a grounded conductive area, so that a neutral salt spray corrosion resistance capability is enhanced, and user experience is improved.

For example, the third area is used to come into contact with some auxiliary conductive materials such as conductive fabric and electrically conductive foam of the electronic product, so as to connect to a corresponding conductive component in the electronic product. The third area may also be referred to as a grounded conductive area.

It should be understood that the third metal layer may be another metal layer provided that neutral salt spray corrosion resistance performance of the third metal layer is higher than that of a middle frame basis. This embodiment of the present disclosure is not limited thereto.

Figure 14:
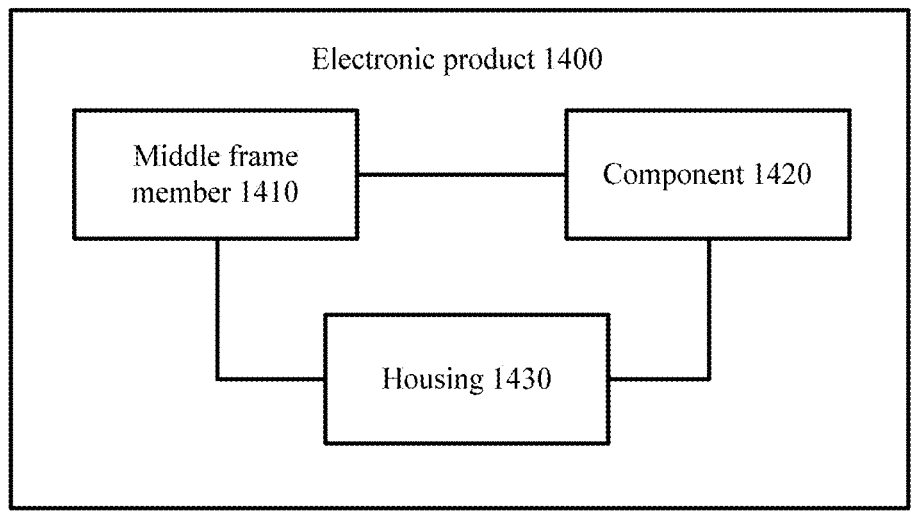
FIG. 14 is a schematic block diagram of an electronic product according to an embodiment of the present disclosure.

FIG. 14 is a schematic block diagram of an electronic product according to another embodiment of the present disclosure. An electronic product 1400 shown in FIG. 14 includes the middle frame member 1410 shown in FIG. 11 to FIG. 13, a component 1420, and a housing 1430. The component 1420 is accommodated in the housing 1430, the middle frame member 1410 is configured to support the component 1420, and the middle frame member 1410 and the housing 1430 are assembled together. The housing 1430 may be configured to protect the middle frame member 1410 and the component 1420.

For example, the electronic product 1400 may include but is not limited to a mobile phone, a Pad, a computer, an ebook, a mobile station, and the like provided that this component includes a middle frame member, a component supported by the middle frame member, and a housing. This embodiment of the present disclosure is not limited thereto.

It should be understood that the component 1420 may include at least one of a printed circuit board PCB, a chip, a battery, or a screen.

It should be understood that the component in this embodiment of the present disclosure may further include another component, for example, may further include components such as an antenna and a camera. This embodiment of the present disclosure is not limited thereto.

Figure 15:
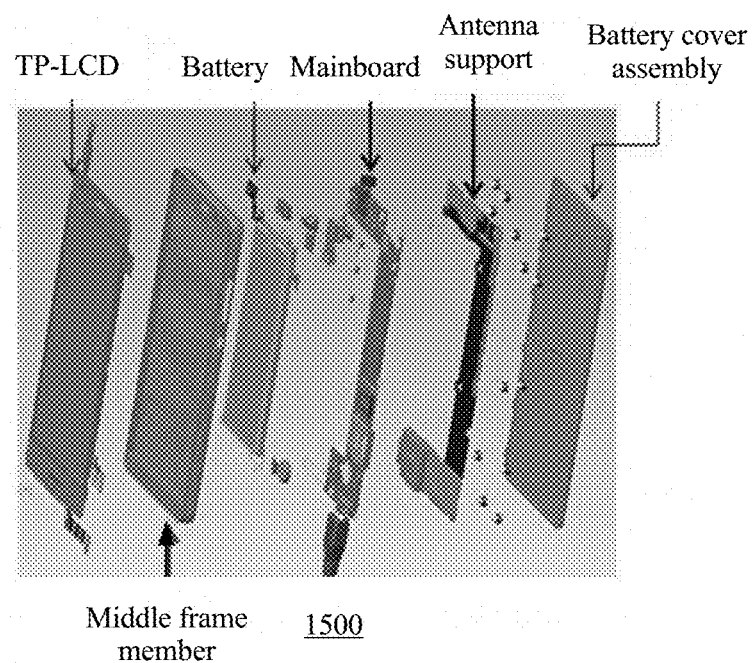
FIG. 15 is a schematic block diagram of an electronic product according to an embodiment of the present disclosure.

For example, FIG. 15 is a structural block diagram when the electronic product 1400 is a mobile phone. An electronic mobile phone 1500 shown in FIG. 15 may include: a screen, such as a touch panel (TP) and a liquid crystal display (LCD), that is, a TP-LCD; a middle frame member; a battery; a mainboard, where the mainboard may include a printed circuit board PCB, a chip, a camera, and the like; an antenna support, where the antenna support may be used for placing an antenna; and a housing, such as a battery cover assembly.

It should be understood that FIG. 15 is merely an example, and shapes and structures of product components shown in FIG. 15 are merely examples. Specific shapes and positions of the components are changed according to actual use. This is not limited in this embodiment of the present disclosure.

It should be understood that "an embodiment" or "an embodiment" mentioned in the entire specification does not mean that particular features, structures, or characteristics related to the embodiment are included in at least one embodiment of the present disclosure. Therefore, "in an embodiment" or "in an embodiment" appearing throughout the specification does not necessarily indicate a same embodiment. In addition, these particular features, structures, or characteristics may be combined in one or more embodiments in any appropriate manner. It should be understood that sequence numbers of the foregoing processes do not mean execution sequences in various embodiments of the present disclosure. The execution sequences of the processes should be determined according to functions and internal logic of the processes, and should not be construed as any limitation on the implementation processes of the embodiments of the present disclosure.

The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that in the embodiments of the present disclosure, "B corresponding to A" indicates that B is associated with A, and B may be determined according to A. However, it should further be understood that determining A according to B does not mean that B is determined according to A only; that is, B may also be determined according to A and/or other information.

It may be clearly understood by persons skilled in the art that, for the purpose of convenient and brief description, for a detailed working process of the foregoing system, apparatus, and unit, refer to a corresponding process in the foregoing method embodiments, and details are not described herein again.

In summary, what is described above is merely example embodiments of the technical solutions of the present disclosure, but is not intended to limit the protection scope of the present disclosure. Any modification, equivalent replacement, or improvement made without departing from the spirit and principle of the present disclosure shall fall within the protection scope of the present disclosure.

What is claimed is:

1. A middle frame member, comprising:
   a middle frame substrate body, wherein the middle frame member is a support part inside an electronic product for supporting components in the electronic product;
   a first metal layer, attached to a first area of the middle frame substrate body, wherein a coefficient of heat conductivity of the first metal layer is greater than a coefficient of heat conductivity of the middle frame substrate body, the first area comprises all or a part of an outer surface of the middle frame substrate body, and the first metal layer is used to conduct, to the middle frame substrate body, heat generated by at least one of the components that is in contact with or adjacent to the first metal layer;
   a second metal layer, attached to the second area on the surface of the middle frame substrate body, wherein an electrode potential difference between the second metal layer and the metal antenna spring plate is less than an electrode potential difference between the middle frame substrate body and the metal antenna spring plate; and
   a passivated insulation layer, attached to a surface of the first metal layer.

2. The middle frame member of claim 1, wherein the components in the electronic product comprise one or more of a printed circuit board PCB, a chip, a battery, or a screen.

3. The middle frame member of claim 1, wherein the first metal layer comprises one or more of:
   a copper layer, a silver layer, or a gold layer.

4. The middle frame member of claim 1, wherein the first area comprises all or a part of the outer surface of the middle frame substrate body except an area in which electricity is conducted; and
   the first metal layer is attached to the area that is on the outer surface of the middle frame substrate body and in which electricity is conducted.

5. The middle frame member of claim 4, wherein the area in which electricity is conducted comprises one or more of a second area or a third area, the second area is used to electrically connect to a metal antenna spring plate in the electronic product, and the third area is used to connect to a grounded conductive component in the electronic product, to ground the middle frame member.

6. The middle frame member of claim 1, wherein a material of the metal antenna spring plate comprises gold and the second metal layer comprises a silver layer or a gold layer.

7. The middle frame member of claim 1, wherein the middle frame member further comprises:

a third metal layer, attached to the third area on the surface of the middle frame substrate body, wherein a neutral salt spray corrosion resistance capability of the third metal layer is higher than that of the middle frame substrate body.

8. The middle frame member of claim 7, wherein the third metal layer comprises a gold layer or a silver layer.

9. The middle frame member of claim 1, wherein the middle frame substrate comprises one or more of: die casting aluminum alloy, die casting magnesium alloy, die casting zinc alloy, or stainless steel.

10. A middle frame member, comprising:
a middle frame substrate body, wherein the middle frame member is a support part inside an electronic product for supporting components in the electronic product; and
a second metal layer, attached to a second area on a surface of the middle frame substrate body, wherein the second area is used to connect to a metal antenna spring plate in the electronic product, and an electrode potential difference between the second metal layer and the metal antenna spring plate is less than an electrode potential difference between the middle frame substrate body and the metal antenna spring plate.

11. The middle frame member of claim 10, wherein the components in the electronic product comprise one or more of a printed circuit board PCB, a chip, a battery, or a screen.

12. The middle frame member of claim 10, wherein a material of the metal antenna spring plate comprises gold, and the second metal layer comprises a silver layer or a gold layer.

13. The middle frame member of claim 10, wherein the middle frame member further comprises:
a third metal layer, attached to a third area on the surface of the middle frame substrate body, wherein the third area is connected to a grounded conductive component in the electronic product, to ground the middle frame member, and a neutral salt spray corrosion resistance capability of the third metal layer is higher than that of the middle frame substrate body.

14. The middle frame member of claim 13, wherein the third metal layer comprises a gold layer or a silver layer.

15. An electronic product, comprising:
a middle frame member comprising:
a middle frame substrate body;
a first metal layer, attached to a first area of the middle frame substrate body, wherein a coefficient of heat conductivity of the first metal layer is greater than a coefficient of heat conductivity of the middle frame substrate body, the first area comprises all or a part of an outer surface of the middle frame substrate body, and the first metal layer is used to conduct, to the middle frame substrate body, heat generated by at least one of the components that is in contact with or adjacent to the first metal layer;
a second metal layer, attached to the second area on the surface of the middle frame substrate body, wherein an electrode potential difference between the second metal layer and the metal antenna spring plate is less than an electrode potential difference between the middle frame substrate body and the metal antenna spring plate;
a passivated insulation layer, attached to a surface of the first metal layer;
one or more components; and
a housing, wherein the one or more components are accommodated in the housing, the middle frame member is configured to support the one or more components, and the middle frame member and the housing are assembled together.

16. The electronic product according to claim 15, wherein the one or more components comprise one or more of a printed circuit board PCB, a chip, a battery, or a screen.

* * * * *